(12) United States Patent
Yuda

(10) Patent No.: US 7,531,866 B2
(45) Date of Patent: May 12, 2009

(54) NON-VOLATILE SEMICONDUCTOR MEMORY DEVICE, DRIVE METHOD AND MANUFACTURING METHOD

(75) Inventor: Takashi Yuda, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/294,442

(22) Filed: Dec. 6, 2005

(65) Prior Publication Data

US 2006/0180849 A1    Aug. 17, 2006

(30) Foreign Application Priority Data

Feb. 14, 2005   (JP) .............................. 2005-036144

(51) Int. Cl.
*H01L 29/792* (2006.01)

(52) U.S. Cl. ............... 257/324; 257/326; 257/E29.305; 257/E29.309

(58) Field of Classification Search ................ 257/315, 257/316, 319, 320, 324, 326, E29.301, E29.305, 257/E29.309

See application file for complete search history.

(56) References Cited

U.S. PATENT DOCUMENTS 6,580,120 B2 *   6/2003   Haspeslagh ................. 257/315
2002/0196665 A1 *  12/2002   Kim ..................... 365/185.22

FOREIGN PATENT DOCUMENTS

| JP | 2001-168219 | | 6/2001 |
| JP | 2001168219 A | * | 6/2001 |
| JP | 2003-51558 | | 2/2003 |

* cited by examiner

*Primary Examiner*—Matthew E Warren
(74) *Attorney, Agent, or Firm*—Rabin & Berdo, P.C.

(57) ABSTRACT

A MONOS type non-volatile semiconductor memory device has a memory cell array. The memory cell array includes a plurality of pairs of bit line and control line. These bit line-control line pairs are parallel to the channel on the substrate. The memory cell array also includes a plurality of memory cells. Each memory cell has a two-transistor configuration. A certain number of memory cells are disposed between the bit line and control line of each pair. These memory cells are connected in series, and connected with the bit line and control line alternately. The first gate electrode and second gate electrode in the memory cell are formed in strips in a direction perpendicular to the channel.

4 Claims, 19 Drawing Sheets

NON-VOLATILE SEMICONDUCTOR MEMORY DEVICE, DRIVE METHOD AND MANUFACTURING METHOD

BACKGROUND OF THE INVENTION

1. Field of the Invention

The present invention relates to a non-volatile semiconductor memory device, such as a flash memory, of which charge injection is a source side injection (hereafter called "SSI") and the charge storage format is MONOS (Metal-Oxide-Nitride-Oxide Semiconductor). The present invention also relates to a drive method of such non-volatile semiconductor memory device, and a manufacturing method of such non-volatile semiconductor memory device.

2. Description of the Related Art

The conventional technology on a non-volatile semiconductor memory drive, such as a flash memory, is disclosed, for example, in Japanese Patent Laid-Open No. 2001-168219 and Japanese Patent Laid-Open No. 2003-51558.

Japanese Patent Laid-Open No. 2001-168219 discloses a non-volatile semiconductor memory, such as a flash memory, which can improve the write speed while maintaining the operation voltage to a constant voltage.

As Japanese Patent Laid-Open No. 2001-168219 discloses, a non-volatile semiconductor memory has an FG (Floating Gate) type, in which the storage means for holding charges is continuous on a plane, and a MONOS type, in which the charge storage means is discrete on a plane. In the MONOS type, a carrier trap is spatially spread (in the plane direction and film thickness direction) in a nitride film which primarily holds charges, or in the interface of the top insulation film and nitride film. Thus, the charge holding characteristics depends on the energetic and spatial distribution of the charges trapped in the tunnel insulation film and in the carrier trap of the nitride film. In the case of the FG type, if a leak current path is locally generated in this tunnel insulation film, many charges pass through the leak path, and the charge holding characteristics drop. On the other hand, in the case of the MONOS type, the charge storage means is spatially discrete, so that only some charges around the leak path leak locally. Thus, the charge holding characteristics do not drop very much, and the MONOS type is superior to the FG type in miniaturizing the memory cells by decreasing the gate length. In order to implement a micro-memory by the MONOS type, an improvement of the disturb characteristic (write error characteristic) is critical. To achieve this improvement, it is necessary to increase the film thickness of the tunnel insulation film. However, the increased film thickness makes it difficult to improve the write speed with a low operation voltage.

In order to increase the write speed while reducing an operation voltage, Japanese Patent Laid-Open No. 2001-168219 proposes an improved MONOS type non-volatile semiconductor memory device. This non-volatile semiconductor memory device includes a substrate, a channel formation region on the surface of the substrate, a source region and drain region formed on the surface of the substrate sandwiching the channel formation region, a gate insulation film which encloses the charge storage means (carrier trap) which is discrete in the plane direction facing the channel formation region and in the film thickness direction, and a gate electrode formed on the gate insulation film.

The non-volatile semiconductor memory according to Japanese Patent Laid-Open No. 2001-168219 can smoothly store 1 bit of data in one memory cell, but when storing two bits of data, complicated control is required on the operation voltage to be applied. Japanese Patent Laid-Open No. 2003-51558 proposes a technology to overcome this problem.

In Japanese Patent Laid-Open No. 2003-51558, the MONOS type non-volatile semiconductor memory device injects charges for writing from the substrate side into the gate insulation film having the charge storage means. For erasing, the stored charges are drained to the substrate side, or charges with reverse polarity, to cancel the stored charges, are injected into the gate insulation film. To inject charges, the tunnel phenomena of charges in the gate insulation film is used, or charges are energetically excited up to a level which allows them to mount (climb) the insulation barrier of the lowest layer of the gate insulation film (CHE (Channel-Hot-Electron) injection). The SSI method is known as a type of CHE.

In the SSI method, an electrode for controlling the drain side channel and an electrode for controlling the source side channel are formed separately. When charges are injected, the drain side channel is set to a strong inversion status and the source side channel is set to a weak inversion status. As a result, a high electric field is generated around the boundary of the drain side channel and source side channel, and charges supplied from the source side are excited by this high electric field. The charges are then supplied from the source side to the charge storage means under the electrode for controlling the drain side channel. This injection efficiency is improved by about one digit compared with an ordinary CHE injection.

In order to further improve the injection efficiency of the SSI method, the MONOS type non-volatile semiconductor memory device based on the SSI method according to Japanese Patent Laid-Open No. 2003-51558 includes: a second conductive type inversion layer formation region which is formed in a channel formation region on the surface of the substrate such that a channel is formed by an inversion layer; a first conductive type first and second storage layer formation regions which are disposed on both sides of the inversion layer formation region in the channel formation region such that a channel is formed by a multi-carrier storage layer, a first conductive type source region and drain region formed outside the first and second storage layer formation regions; a first memory gate electrode formed on the first storage layer formation region and the source region via a first multi-layer film which has a charge storage capability; a second memory gate electrode formed on the second storage layer formation region and the drain region via the second multi-layer film which has a charge storage capability; and a control gate electrode formed on the inversion layer formation region via a single layer dielectric film which has no charge storage capability.

The operation, when electrons are injected into the second multi-layer film by the SSI method, is described. In writing, the reference voltage Vs (=0V) is applied to the source region, drain voltage Vd (=5.0V) to the drain region, positive voltage Vcg (=1.0V) to the control gate electrode, and positive voltage Vmg (=7.0V) to the first and second memory gate electrodes. As a result, the inversion layer is formed in the inversion layer formation region, and the storage layers are formed on the first and second storage layer formation regions on both sides of the inversion layer. Electrons supplied from the storage layer at the source side are accelerated in the inversion layer, and a part of the electrons becomes Hot-Electrons which mount over the energy barrier in the second multi-layer film at the drain side, and a part of these high energy electrons is injected into the second multi-layer film at a certain probability.

The potential difference between the drain voltage Vd and the source voltage Vs is mainly applied to the channel region directly under the space between the control electrode and second memory gate electrode at the drain side, and a high electric field is generated in this channel region. Because this high electric field makes electrons in the inversion layer channel into high energy electrons, electrons are injected into the second multi-layer film. In order to increase this injection efficiency, the voltage to be applied to the control gate electrode and second memory gate electrode is controlled so that the electric field in the channel direction concentrates to the same region as the electric field in the vertical direction of the channel concentrates.

When writing is performed to the first multi-layer film at the source side, electrons are efficiently injected into the first multi-layer film by reversing the voltage relationship between the source region and drain region based on the same principle. Consequently, 2-bit data can be independently written to one memory cell.

In the MONOS type non-volatile semiconductor memory device based on SSI disclosed in Japanese Patent Laid-Open No. 2003-51558, the charge injection efficiency is high and high-speed operation is possible, but the memory structure is complicated and manufacturing is very difficult, since three gate electrodes (first and second memory gate electrodes and control gate electrode) are formed in one memory cell, and the first and second storage layer formation regions are formed on both sides of the inversion layer formation region in the channel formation region. Also, control is complicated because the number of voltages to be applied to the gate electrodes and other components during operation is numerous.

SUMMARY OF THE INVENTION

One object of the present invention is to provide a MONOS type non-volatile semiconductor memory device based on the SSI method, of which manufacturing is made easy by simplifying the memory cell structure, and of which control is made easy by reducing the number of voltage to be applied during operation.

Another object of the present invention is to provide a drive method for such semiconductor memory device.

Still another object of the present invention is to provide a manufacturing method of such semiconductor memory device.

According to a first aspect of the present invention, there is provided a non-volatile semiconductor memory device having a plurality of memory cells. The memory cells are formed and arranged in a matrix on a substrate. The memory cells are structured as follows.

Each memory cell includes a first conductive type active region formed on the surface of the substrate. The memory cell also includes a second conductive type first impurity region and a second conductive type second impurity region formed in the active region such that the second conductive type first impurity region and second conductive type second impurity region sandwich a channel formation region. The memory cell also includes a first gate insulation film which has a charge storage capability and is formed closer to the first impurity region side on the channel formation region. The memory cell also includes a second gate insulation film which has a charge storage capability and is formed closer to the second impurity region side on the channel formation region. The memory cell also includes a first gate electrode formed on the first gate insulation film. The memory cell also includes an inter-gate-electrode insulation film formed on the channel formation region. The memory cell also includes a second gate electrode which is disposed next to said first gate electrode via said inter-gate-electrode insulation film. The second gate electrode is formed on the second gate insulation film.

In the non-volatile semiconductor memory device of the present invention, only two types of gate electrodes are formed on the memory cell. Thus, the structure is simpler and manufacturing is easier compared to a conventional memory cell having three types of gate electrodes. Also the gate length can be decreased so that writing and reading can be performed at higher speed. Further, the writing is possible at low current and low voltage, so that power consumption can be decreased.

The substrate may be a silicon substrate, well, or SOI layer.

The first gate insulation film may be an insulation film with a three-layer structure of upper oxide film (O), nitride film (N) that has a charge storage capability, and lower oxide film (O). The second gate insulation film may be an insulation film with a three-layer structure of O/N/O. The inter-gate-electrode insulation film may be formed between the first gate insulation film and the first gate electrode, and the second gate insulation film and the second gate electrode.

The non-volatile semiconductor memory device may further include a plurality of pairs of bit line and control line formed in parallel with the channel on the substrate. Some of the memory cells adjacent to each other may be disposed between the bit line and control line of each pair. These neighboring memory cells may be connected in series. Specifically, the first impurity region and second impurity region may be electrically connected to each other, and the memory cells may be connected to the bit line and the control line alternately. The first gate electrode and second gate electrode in the memory cell may be formed in strips in a direction perpendicular to the channel.

According to another aspect of the present invention, there is provided a drive method for a non-volatile semiconductor memory device. When data is written to the second gate insulation film by injecting electrons in the non-volatile semiconductor memory, the data is written by applying to the second impurity region a voltage higher than that applied to the first impurity region, and applying to the second gate electrode a voltage higher than that applied to the first gate electrode, and controlling the current that flows through the channel formation region to be a constant current.

According to still another aspect of the present invention, there is provided another drive method for a non-volatile semiconductor memory device. When the data stored in the second gate insulation film is read in the non-volatile semiconductor memory device, the data in the second insulation film is read by applying a voltage to the first gate electrode and first impurity region, and spreading a depletion layer under the first gate electrode to avoid the influence of the data of the first gate insulation film.

According to yet another aspect of the present invention, there is provided a manufacturing method for a non-volatile semiconductor memory device. The manufacturing method includes a step of forming a first conductive type active region on the surface of a substrate. The manufacturing method also includes a step of forming a first opening by forming a first gate insulation film material on an entire surface of the substrate, forming a sacrifice film on the first gate insulation film material, and etching the active region area in the sacrifice film using a mask pattern as a mask. The manufacturing method also includes a step of forming a first gate electrode material on an entire surface and forming a first gate electrode made of the first gate electrode material on the side face of the inner wall of the first opening by etching the entire face of the first gate electrode material. The manufacturing method also includes a step of forming a second conductive type second impurity region by implanting impurity ions into the active region using the sacrifice film having the first opening and the first gate electrode as a mask. The manufacturing method also includes a step of planarizing the surface by filling the first opening with an insulation film and then removing the sacrifice film by etching.

The manufacturing method further includes a step of forming a second gate insulation film material on the entire surface, and then forming a second gate electrode material on the second gate insulation film material. The manufacturing method further includes a step of etching the entire face of the second gate electrode material to leave the second gate electrode material and the second gate insulation film material on the side wall area of the first gate electrode. The manufacturing method also includes a step of forming an inter-gate-electrode insulation film made of the second gate insulation film material adhered to the side wall of the first gate electrode, a second gate insulation film made of the second gate insulation film material adhered to the substrate, and a second gate electrode made of the second gate electrode material adhered to the second gate insulation film and the inter-gate-electrode insulation film. The manufacturing method further includes a step of forming a second conductive type first impurity region by implanting impurity ions from a second opening between the second gate electrodes into the active region.

According to this manufacturing method, a mask, such as a resist pattern, to be used for manufacturing the memory cells, is created only twice, namely, when the active region is formed and when the sacrifice film is etched. The rest of the manufacturing method mostly depends on self-aligning. Therefore, the irregularity in the memory cell characteristics caused by mask misalignment does not occur. Also, the memory size can be decreased because a mask alignment margin is unnecessary. Further, the manufacturing cost can be decreased since memory cells can be formed by two layers of masks.

DETAILED DESCRIPTION OF THE INVENTION

Embodiment 1

Figure 1:
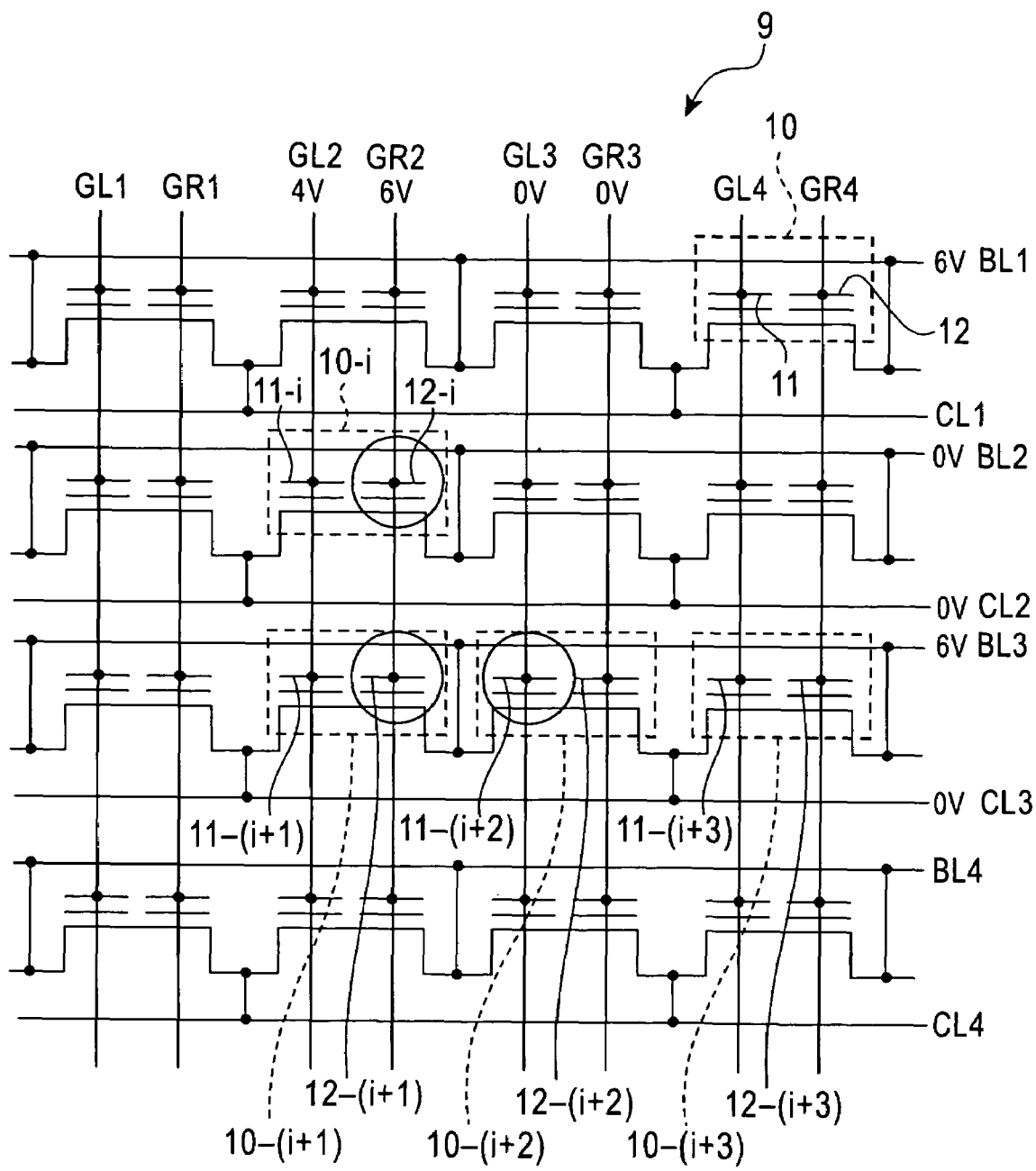
FIG. 1 is a circuit diagram depicting a memory cell array section in a MONOS type non-volatile semiconductor memory device based on the SSI method according to Embodiment 1 of the present invention.

Referring to FIG. 1, a circuit diagram of the memory cell array section 9 in a MONOS type non-volatile semiconductor memory device based on the SSI method according to Embodiment 1 of the present invention will be described.

This memory cell array section 9 is formed on the substrate for semiconductor element formation. The memory cell array 9 includes a plurality of bit lines BL1, BL2, BL3, BL4, ... which extend in parallel with the channel, a plurality of control lines (e.g., source lines) CL1, CL2, CL3, CL4, ... which extend in parallel with the channel between each two adjacent bit line BL1, BL2, BL3, BL4, ..., a plurality of first gate electrodes (e.g., left side gate electrodes) GL1, GL2, GL3, GL4, ... which extend in a direction perpendicular to the channel, and a plurality of second gate electrodes (e.g., right side gate electrodes) GR1, GR2, GR3, GR4, ... which extend in the direction perpendicular to the channel. Each left side gate electrode GL1, GL2, GL3, GL4 ... and each right side gate electrode GR1, GR2, GR3, GR4, ... form a pair of left and right electrodes such as GL1 and GR1, ..., which are spaced from each other at a predetermined interval. These gate electrodes GR and GL are made of n+ polysilicon, for example.

At the intersection of each bit line BL1, ... each control line CL1, ... and each left and right electrode pair GL1 and GR1, ..., the memory cell 10 (10-i, 10-(i+1), 10-(i+2), 10-(i+3), ...) is formed. Each memory cell 10 (10-i, 10-(i+1), 10-(i+2), 10-(i+3), ...) has a two-transistor configuration, in which the left side memory transistor 11 (11-i, 11-(i+1), 11-(i+2), 11-(i+3), ...) and the right side memory transistor 12 (12-i, 12-(i+1), 12-(i+2), 12-(i+3), ...) are connected in series, so that 2 bits of data can be stored respectively. In the memory cells 10 arrayed in the channel direction, every other memory cell makes contact with each bit line BL1, . . . , and the remaining memory cell makes contact with each control line CL1, . . . .

Figure 2A:
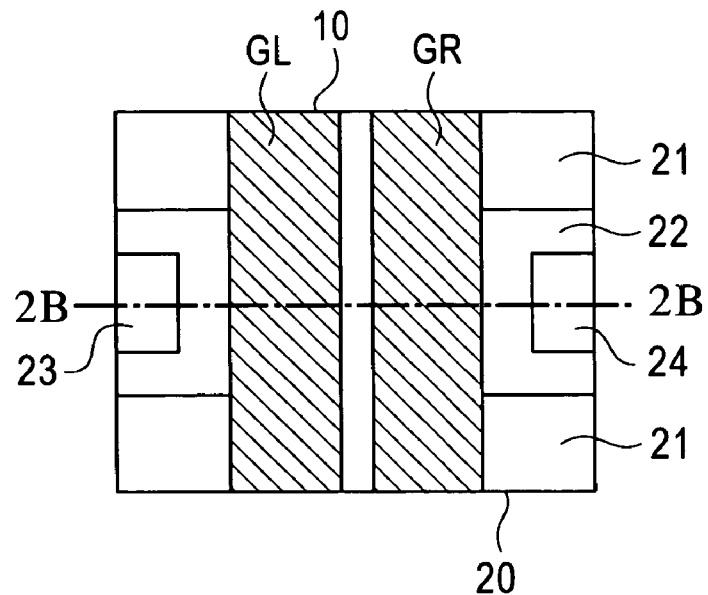
FIG. 2A is a plan view of the memory cell shown in FIG. 1 in the row direction along the bit line.
Figure 2B:
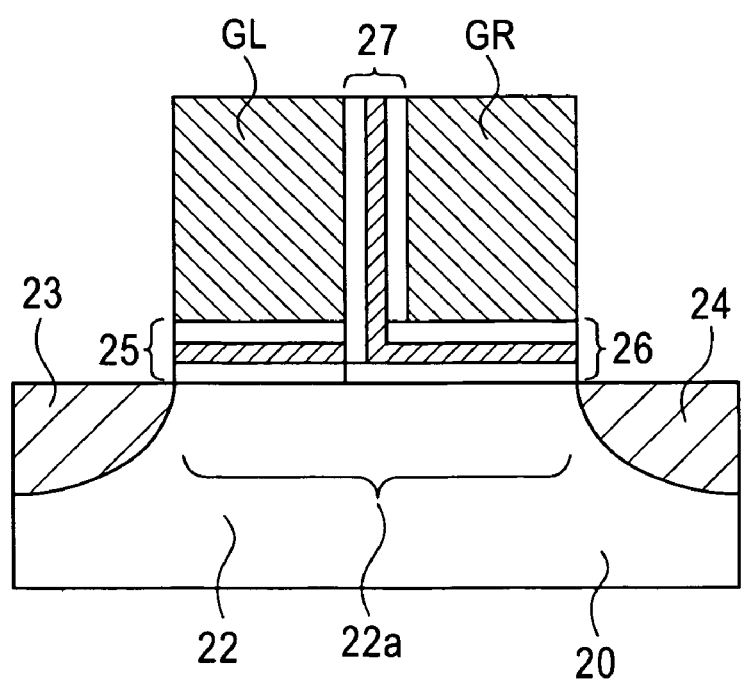
FIG. 2B is a cross sectional view of the memory cell, taken along the line 2B-2B in FIG. 2A.

FIG. 2A and FIG. 2B are diagrams depicting the memory cell 10 in FIG. 1 in the row direction along the bit line BL. Specifically, FIG. 2A is a plan view and FIG. 2B is a cross-sectional view of FIG. 2A along the line 2B-2B. The cross-sectional view of FIG. 2B shows the source region and drain region being formed to make understanding easier.

On the surface of the substrate (e.g., p-type silicon substrate, p-well, p-type SOI layer) 20 for semiconductor element formation, the element isolation regions 21 for isolating each memory cell 10 are formed, and an active region 22 is formed between each two element isolation regions 21. In the active region 22, the left side impurity region (e.g., source region or drain region which is an n+ impurity diffusion layer) 23, which is the first impurity region, and the right side impurity region (e.g., drain region or source region which is an n+ impurity diffusion layer) 24, which is the second impurity region, sandwich the channel formation region 22a. On the channel formation region 22a between the left side impurity region 23 and right side impurity region 24, the left side gate insulation film (e.g., insulation film such as ONO film with a three-layer structure of oxide film (O)/nitride film for charge storage (N)/oxide film (O)) 25, which is the first gate insulation film having charge storage means, and the right side gate insulation film (e.g., insulation film such as ONO film with a three-layer structure of O/N/O) 26, which is the second gate insulation film having charge storage means, are formed. On the left side gate insulation film 25, the left side gate electrode GL, which is the first gate electrode, is formed, and on the right side gate insulation film 26, the right side gate electrode GR, which is the second gate electrode, is formed. The left side gate insulation film 25 and the left side gate electrode GL are electrically isolated from the right side gate insulation film 26 and the right side gate electrode GR by the inter-gate-electrode insulation film 27. The inter-gate-electrode insulation film 27 is formed by an insulation film with a three-layer structure of O/N/O or by one or a plurality of layers of insulation film.

Although this is not illustrated in FIG. 2A and FIG. 2B, the left side impurity region 23, right side impurity region 24, left side gate electrode GL, right side gate electrode GR and inter-gate-electrode insulation film 27 are covered with an intermediate insulation film, and contact holes are formed on this intermediate insulation film using resist film as an etching mask. The electrodes from the left side impurity region 23 and right side impurity region 24 extend through these contact holes.

(Writing of Memory Cells)

(1) SSI Method of Embodiment 1

Figure 3:
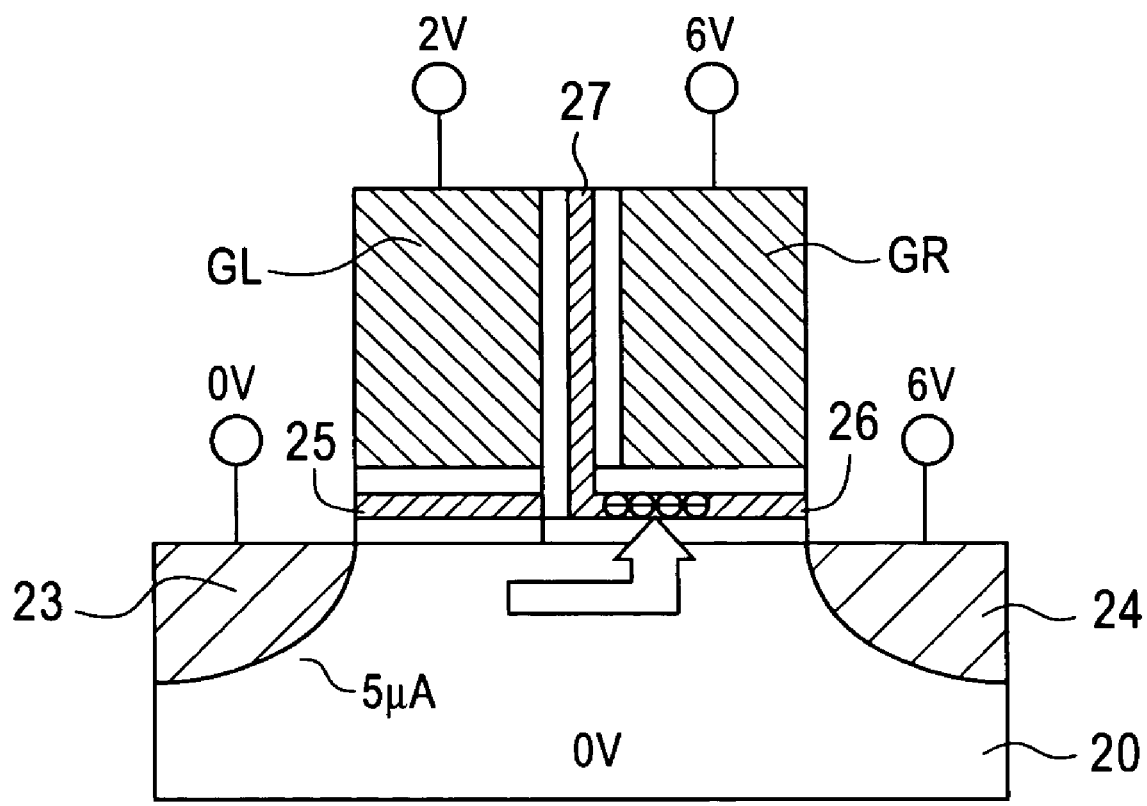
FIG. 3 is a cross-sectional view depicting an example of the voltage conditions for writing in the memory cell shown in FIG. 2B.
Figure 4A:
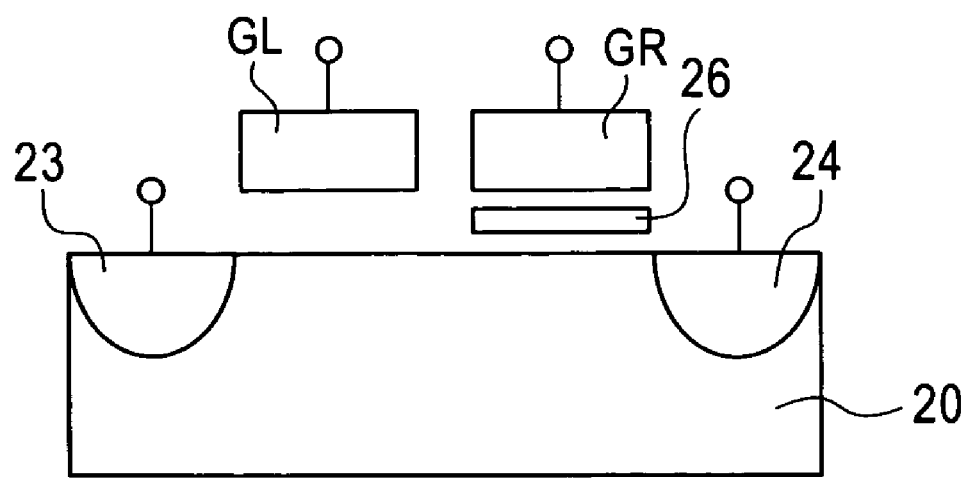
FIG. 4A and FIG. 4B are diagrams depicting the writing in FIG. 3.
Figure 4B:
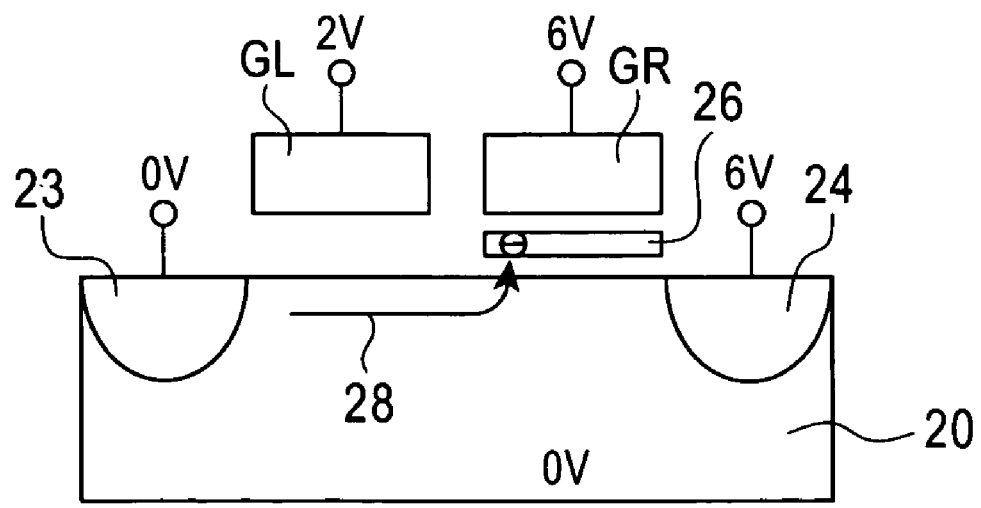

FIG. 3 is a cross-sectional view depicting an example of the write voltage conditions in the memory cell 10 of FIG. 2B. FIG. 4A and FIG. 4B are diagrams depicting the writing in FIG. 3.

For example, in FIG. 3, the case when writing is performed to the memory cell with one gate electrode G by storing electrons in the gate insulation film GI having charge storage means based on the CHE injection method will be considered. The conditions of the voltage to be applied are: 0V for substrate 20, 0V for the left side impurity region 23, 6V for the right side impurity region 24, and 6V for the gate electrode G.

A channel is formed between the left side impurity region 23 and the right side impurity region 24, and electrons move from the left side impurity region 23 to the right side impurity region 24, and are injected into the right side of the gate insulation film G. At this time, the electron injection efficiency is extremely low, such as 1E-6 (one in every million is injected). In order to increase the injection efficiency, heavy (large) current (e.g., up to about 300 μA) is caused to flow. However, this increases the power consumption. To solve this shortcoming, in Embodiment 1, writing is performed by injecting electrons by the SSI method shown in FIG. 4A and FIG. 4B.

When electrons are injected from the left side impurity region 23 to the right side gate insulation film 26 in FIG. 4A, the voltage applying conditions are, for example, 0V for the substrate 20, 0V for the left side impurity region 23, 6V for the right side impurity region 24, 2V for the left side gate electrode GL, which is low voltage since the left side gate electrode GL plays a role of controlling current, and 6V for the right side gate electrode GR, which is high voltage since the right side gate electrode GR plays a role of accelerating electrons.

Electrons generated from the left side impurity region 23 move to the right through the channel formed between the left side impurity region 23 and the right side impurity region 24. A high electric field is generated at 28 between the gates by the 4V potential difference between the left side gate electrode GL and the right side gate electrode GR. Accordingly, electrons are accelerated and injected into the right side of the gate insulation film G. Therefore the injection efficiency improves to be 1E-3 (one in every thousand is injected), for example, and writing can be performed even with light (small) current (up to about 5 μA).

In the memory cell based on the SSI method according to Japanese Patent Laid-Open No. 2003-51558, the first memory gate electrode (corresponds to the left side gate electrode GL in Embodiment 1), the second memory gate electrode (corresponding to the right side gate electrode GR in Embodiment 1), and the control gate electrode between the first and second memory gate electrodes (corresponds to the inter-gate-electrode insulation film 27 in Embodiment 1) are lined up side by side, so that the memory cell size tends to become large. In Embodiment 1, however, one gate electrode GR plays a role of the first memory gate electrode and also a role of the second memory gate electrode, so that the memory cell size can be decreased by ½, for example. It should be noted that some consideration is required to write in the same way when electrons exist in the left side gate insulation film 25 and when the electrons do not exit. In order to cope with this in Embodiment 1, applying voltage is controlled in the following manners (2) to (4).

Figure 5A:
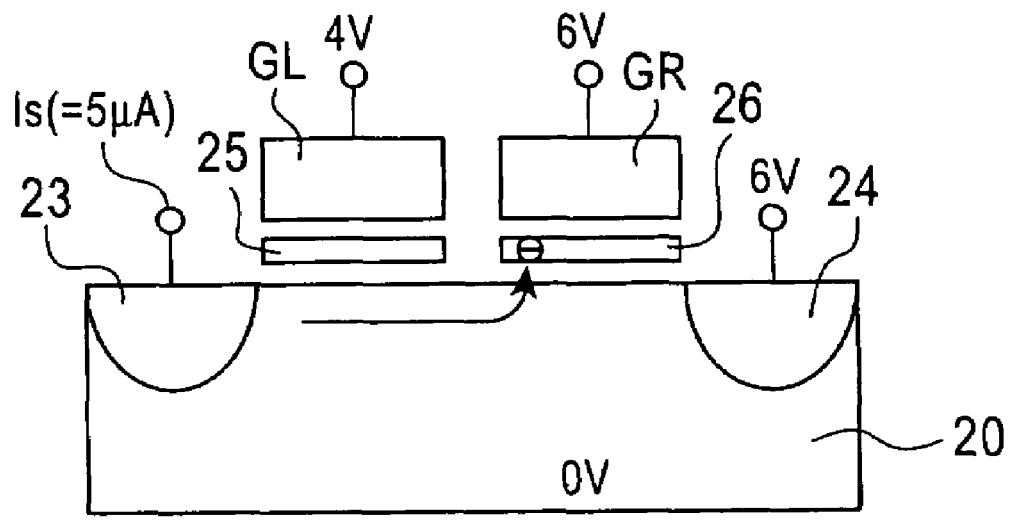
FIG. 5A and FIG. 5B are diagrams depicting the writing to the right side in FIG. 3 when no electrons exist at the left side.
Figure 5B:
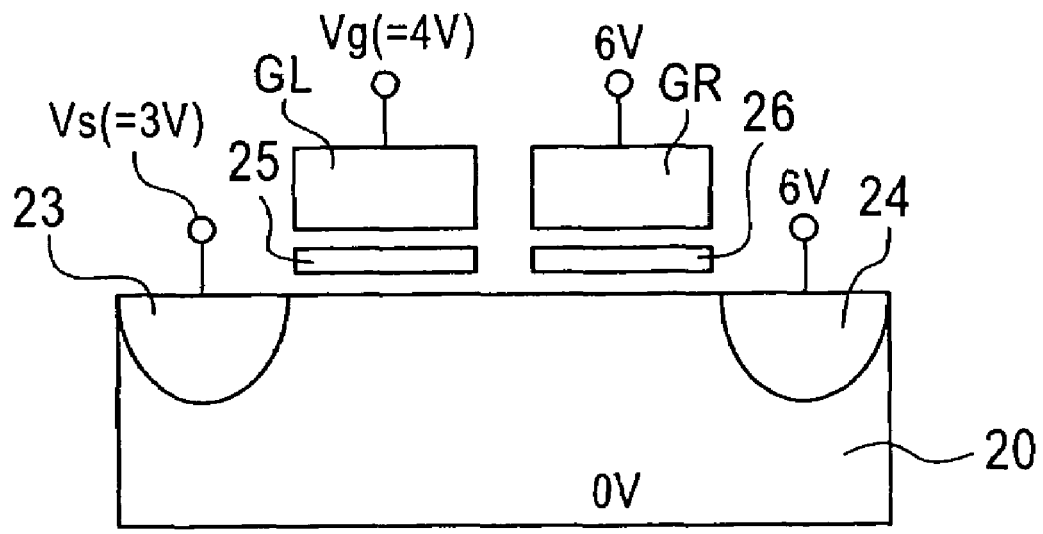

(2) When electrons do not exist in the left side gate insulation film 25 during writing to the right side gate insulation film 26:

FIG. 5A and FIG. 5B are diagrams depicting the case when electrons do not exist at the left side during writing to the right side in FIG. 3.

The voltage applying conditions are, for example, 0V for the substrate 20, 6V for the right side impurity region 24, gate voltage Vg=4V for the left side gate electrode GL, and 6V for the right side gate electrode GR. The left side impurity region 23 is controlled not by applying the source voltage Vs, but by supplying a predetermined source current Is (=about 5 μA).

The source voltage VS fluctuates and becomes about 3V, but electrons do not exist in the left side gate insulation film 25, so that about a 5 μA current can flow from the left side impurity region 23 to the channel even if the potential difference between the gate voltage Vg and the source voltage Vs is small (e.g., 1V). Therefore, writing can be performed well by light current.

Figure 6A:
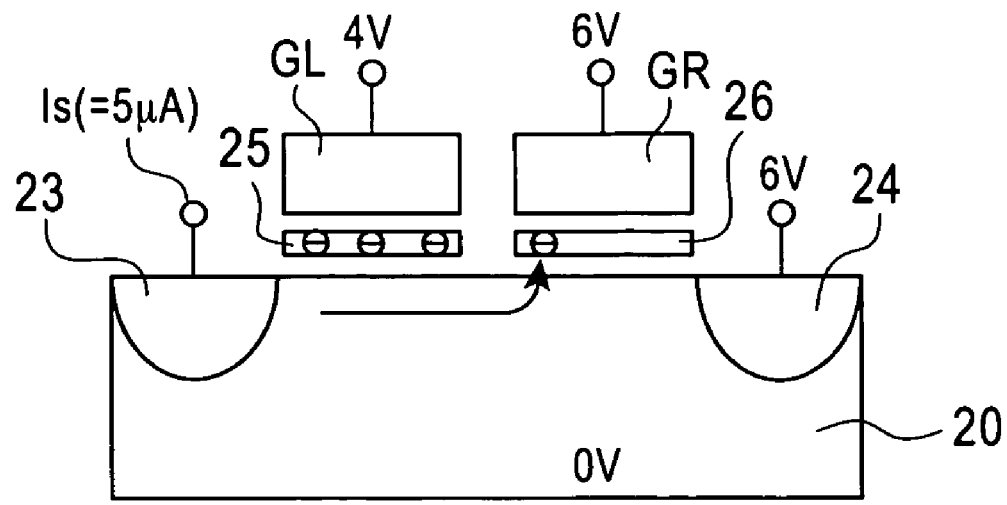
FIGS. 6A and 6B are diagrams depicting the writing to the right side in FIG. 3 when electrons exist at the left side.
Figure 6B:
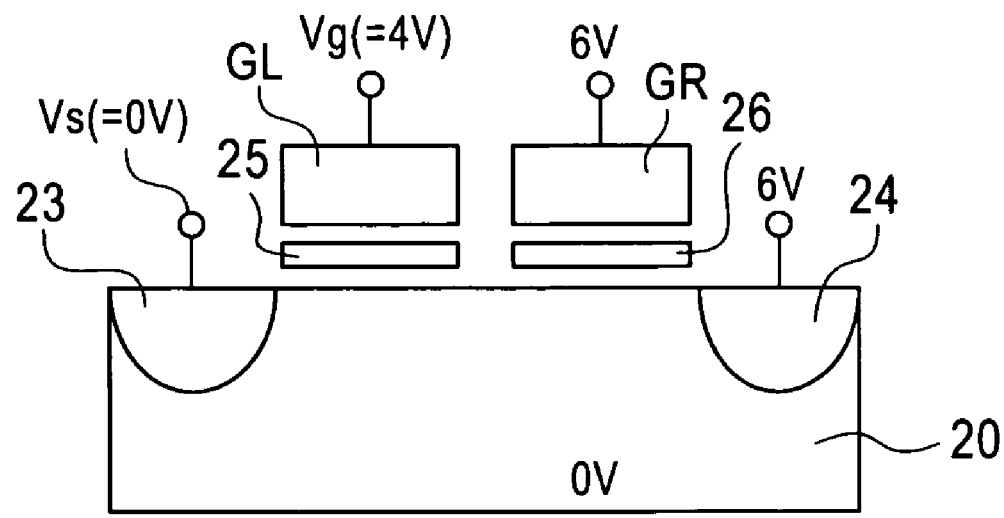

(3) When electrons exist in the left side gate insulation film 25 during writing to the right side gate insulation film 26:

FIG. 6A and FIG. 6B are diagrams depicting the case when electrons exist at the left side during writing to the right side in FIG. 3.

The voltage applying conditions are, for example, 0V for the substrate 20, 6V for the left side impurity region 24, gate voltage Vg=4V for the left side gate electrode GL, and 6V for the right side gate electrode GR. The left side impurity region 23 is controlled not by supplying the source voltage Vs, but by supplying a predetermined source current Is (=about 5 μA).

Since electrons exist in the left side gate insulation film 25, the potential difference between the gate voltage Vg and the source voltage Vs must be high to cause a 5 μA current to flow from the left side impurity region 23 to the channel. The source voltage Vs fluctuates and becomes about 0V, so that the potential difference between the gate voltage Vg and the source voltage Vs can be increased. If the threshold voltage Vt, when electrons are injected into the left side gate insulation film 25, is too high, about a 5 μA current cannot flow to the channel. To avoid this, the threshold voltage Vt must be about 3V.

As described above in connection with FIG. 5A, FIG. 5B, FIG. 6A and FIG. 6B, the left side impurity region 23 is controlled by the source current Is, rather than by the source voltage Vs. Thus, the current that flows through the channel can be constant (e.g., about 5 μA), regardless of whether or not electrons exist in the left side gate insulation film 25, and satisfactory writing can be performed with the small current.

Figure 7:
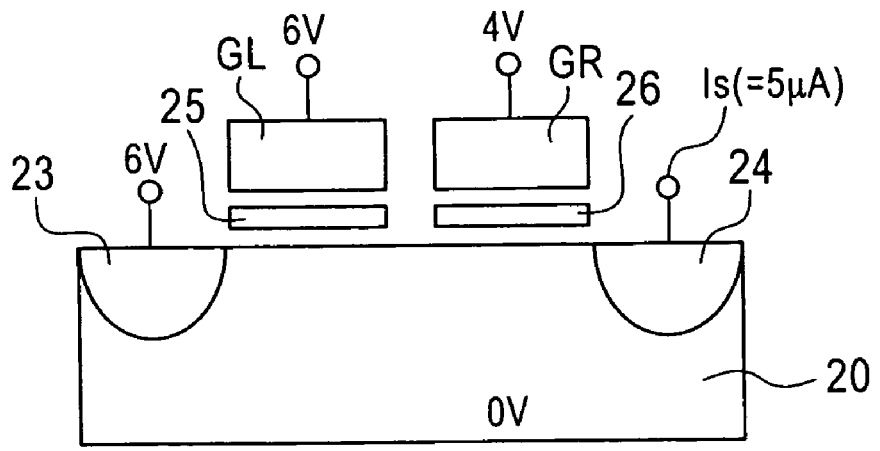
FIG. 7 is a diagram depicting the writing to the left side in FIG. 3 when electrons exist and when electrons do not exist at the right side.

(4) When electrons do not exist and when electrons exist in the right side gate insulation film 25 during writing to the left side gate insulation film 26:

FIG. 7 is a diagram depicting the cases when electrons exist and when electrons do not exist at the right side during writing to the left side in FIG. 3. Compared with FIG. 5A, FIG. 5B, FIG. 6A and FIG. 6B, the voltage applying conditions are reversed here. Specifically, 0V is set for the substrate 20, 6V for the left side impurity region 23, 6V for the left side gate electrode GL, and gate voltage Vg=4V for the right side gate electrode GR. The right side impurity region 24 is controlled by supplying a predetermined source current Is (=about 5 μA). Consequently, similar to FIG. 5A, FIG. 5B, FIG. 6A and FIG. 6B, the current that flows through the channel can be constant (e.g., about 5 μA), independent of whether electrons exist or not in the right side gate insulation film 26. Thus, desired writing can be performed with the small current.

(Erasing of Memory Cells)

Figure 8:
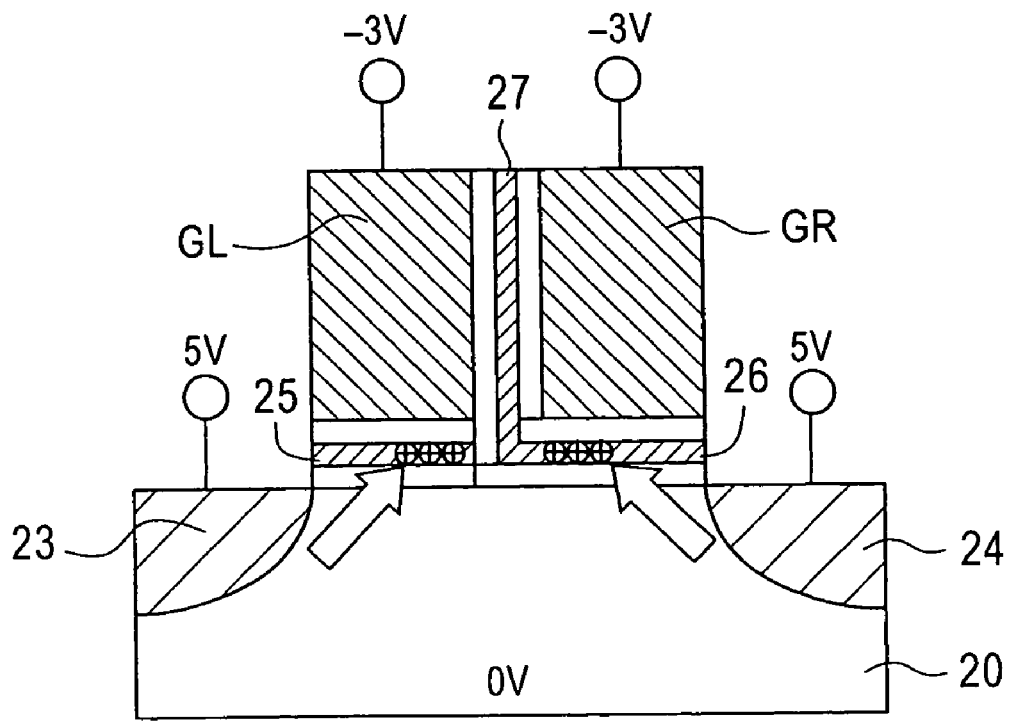
FIG. 8 is a cross-sectional view depicting an example of the voltage conditions for erasing in the memory cell in FIG. 2B.
Figure 9A:
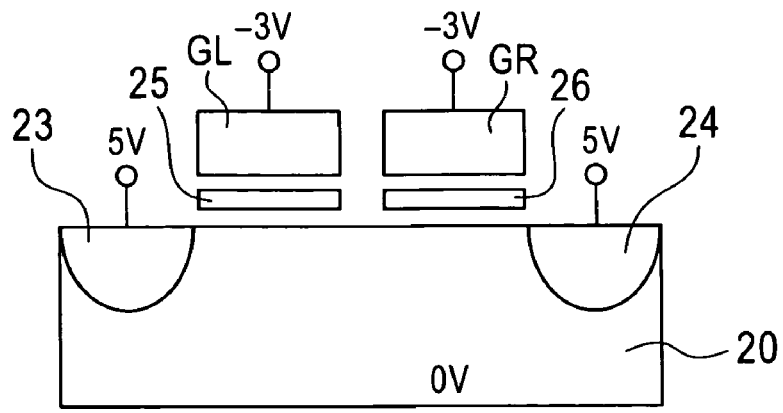
FIG. 9A, FIG. 9B and FIG. 9C are diagrams depicting the erasing in FIG. 8.
Figure 9B:
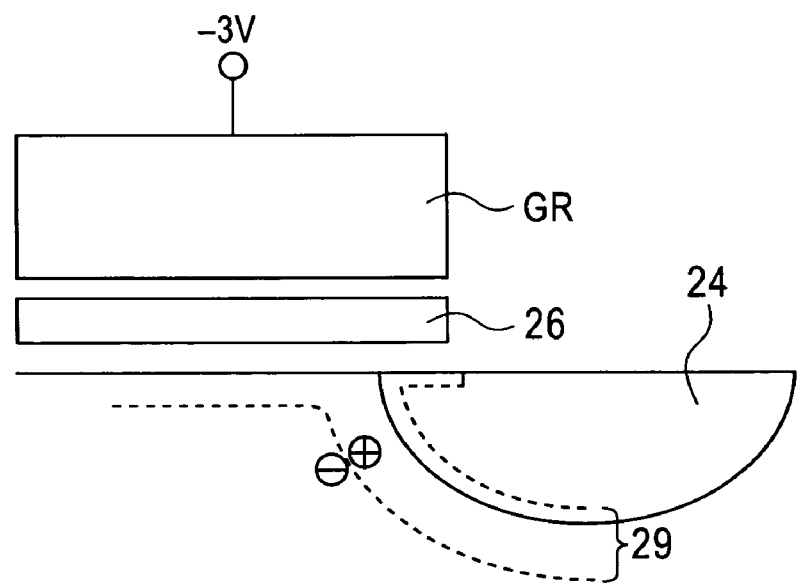
Figure 9C:
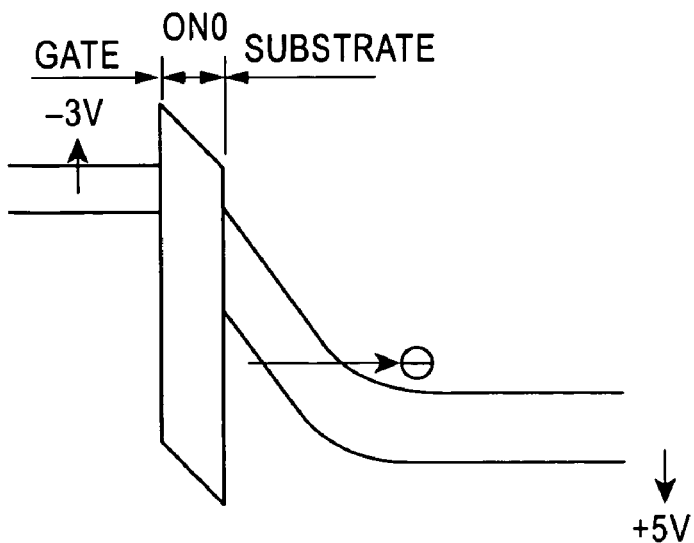

FIG. 8 is a cross-sectional view depicting an example of the voltage conditions for erasing in the memory cell 10 of FIG. 2B. FIG. 9A to FIG. 9C are supplemental diagrams for the erasing in FIG. 8. Specifically, FIG. 9A is a cross-sectional view of the memory cell, FIG. 9B is a partially enlarged view of the joint section of the right side gate insulation film 26 and the right impurity region 24 of the memory cell, and FIG. 9C is an energy band diagram.

In erasing the stored electrons or the holes are erased by injecting charges with reverse polarity into the left side gate insulation film 25 and the right side gate insulation film 26 based on the Band-to-Band Hot Hole Injection method, for example.

The voltage applying conditions are, for example, 0V for the substrate (p-type silicon substrate) 20, 5V for the left side impurity region (n+ source region) 23, 5V for the right side impurity region (n+ drain region) 24, −3V for the left side gate electrode GL and −3V for the right side gate electrode GR. When these voltage are applied, electron-hole pairs are generated in the depletion layer 29 formed at the boundary between the left side impurity region 23 and the right side impurity region 24 and the substrate 20 by Band-to-Band tunneling. The generated electrons tunnel through between bands, but the holes are pulled by the gate electrodes GL and GR and are neutralized by the electrons in the gate insulation films 25 and 26, so that these electrons are erased.

(Reading of Memory Cells)

Figure 10:
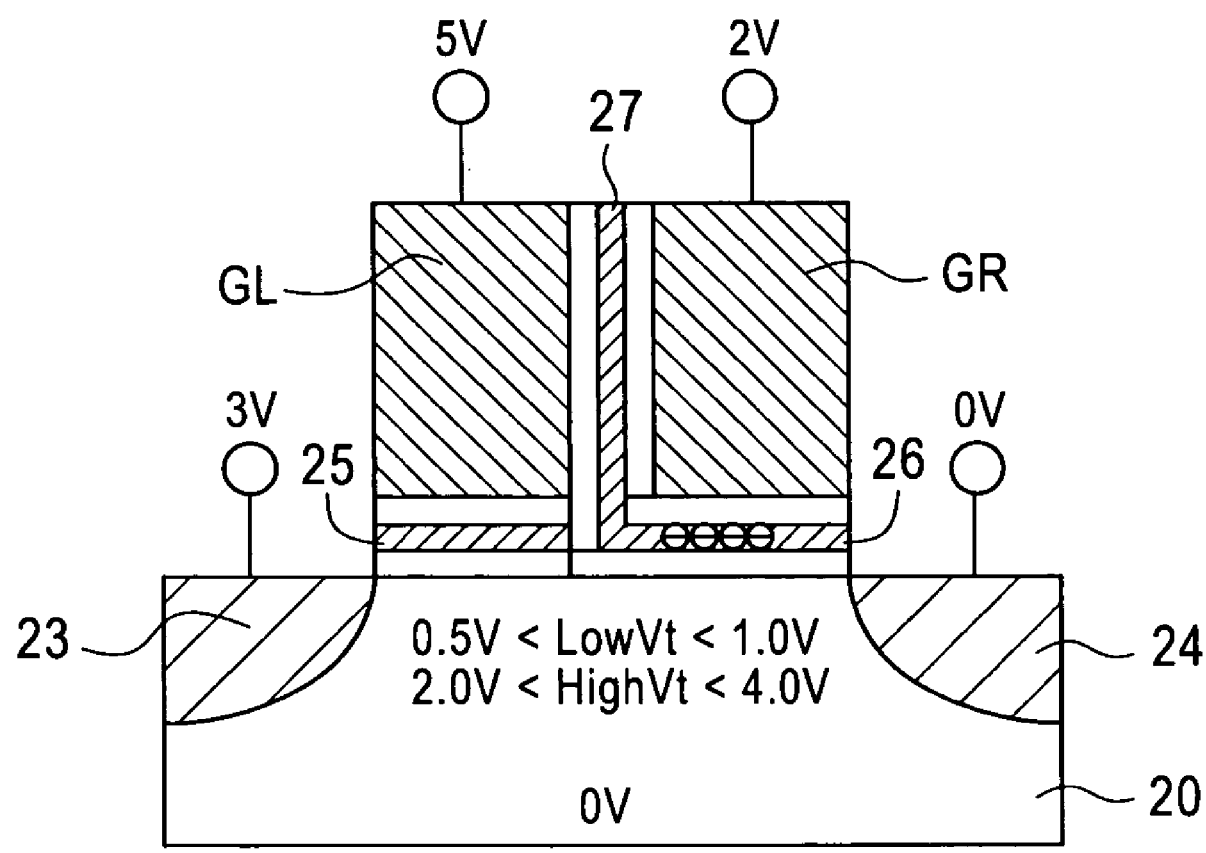
FIG. 10 is a cross-sectional view depicting an example of the voltage conditions for reading in the memory cell of FIG. 2B.
Figure 11A:
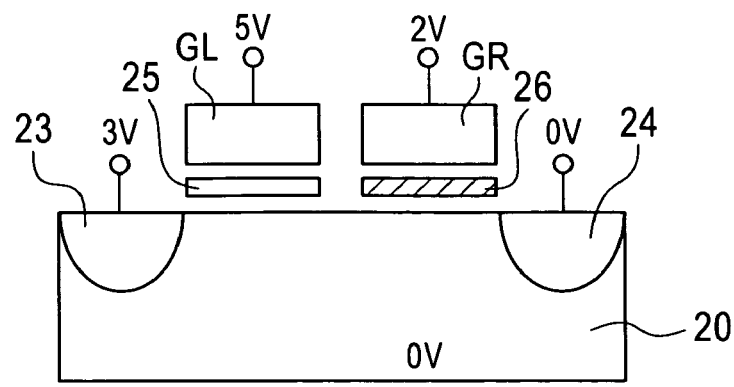
FIG. 11A, FIG. 11B and FIG. 11C are diagrams depicting the reading in FIG. 10.
Figure 11B:
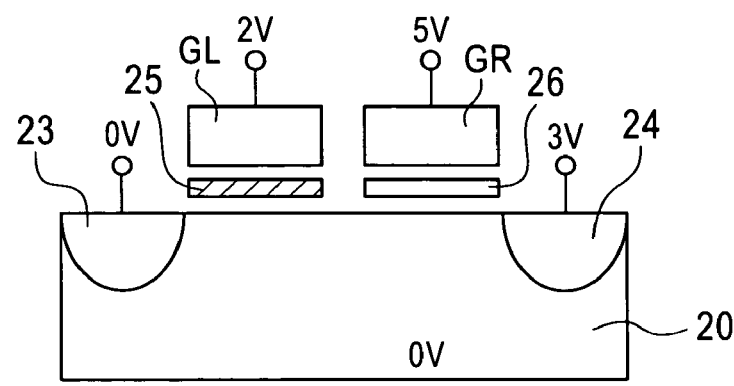
Figure 11C:
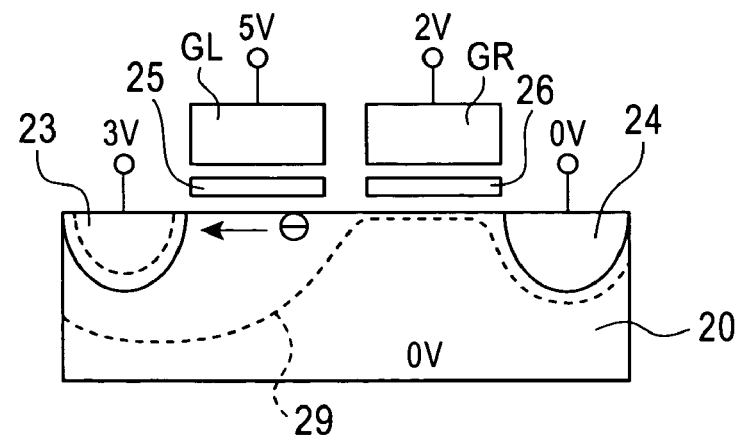

FIG. 10 is a cross-sectional view depicting an example of the voltage conditions for reading in the memory cell 10 of FIG. 2B. FIG. 11A to FIG. 11C are supplemental diagrams for FIG. 10.

For example, as FIG. 11A shows, the data of the left side gate insulation film 25 must not be read when the data of the right side gate insulation film 26 is read. Thus, as FIG. 11C shows, when the data in the right side gate insulation film 26 is read, 0V is applied to the substrate 20, 5V is applied to the left side gate electrode GL, 2V is applied to the right side gate electrode GR, 3V is applied to the left side impurity region 23, and 0V is applied to the right side impurity region 24. At this time, the low level threshold voltage (Low Vt) is 0.5V<Low Vt<1.0V, and the high level threshold voltage (High Vt) is 2.5V<High Vt<4.0V. Then the data in the left side gate insulation film 25 is not read since the depletion layer 29 is spread under the left side gate electrode GL and the electrons cannot be controlled at the left side. As a result, current flows through the channel regardless of existence and absence of the electrons exist in the left side gate insulation film 25. Accordingly, data in the right side gate insulation film 26 can be read correctly.

As FIG. 11B shows, when the data in the left side gate insulation film 25 is read, the data in the right side gate insulation film 26 must not be read. Thus, the reverse voltage of FIG. 11C is applied, so that current flows through the channel whether electrons exist or not in the right side gate insulation film 26, and data in the left side gate insulation film 25 can be read correctly. Details will be described below.

FIG. 12A to FIG. 12D are diagrams depicting examples of the voltage conditions for reading the right side in the memory cell 10 shown in FIG. 2B.

When the data in the right side gate insulation film 26 is read, the voltage applying conditions are, for example, 0V for the substrate 20, 5V for the left side gate electrode GL, 2V for the right side gate electrode GR, 3V for the left side impurity region 23, and 0V for the right side impurity region 24. When electrons do not exist in the left side gate insulation film 25 and the right side gate insulation film 26 in FIG. 12A, the left side cannot be read because the depletion layer 29 spreads to the left side. Also, electrons generated from the right side impurity region 24 flow into the left side impurity region 23 via the channel, and only data at the right side becomes readable. Thus, data in the right side gate insulation film 26 can be read correctly.

Figure 12A:
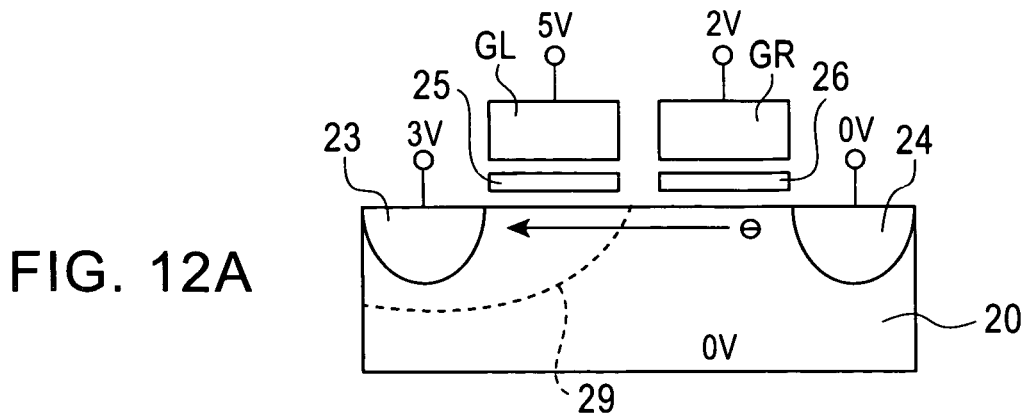
FIG. 12A, FIG. 12B, FIG. 12C and FIG. 12D are diagrams depicting examples of the voltage conditions for reading the right side in the memory cell shown in FIG. 2B.
Figure 12B:
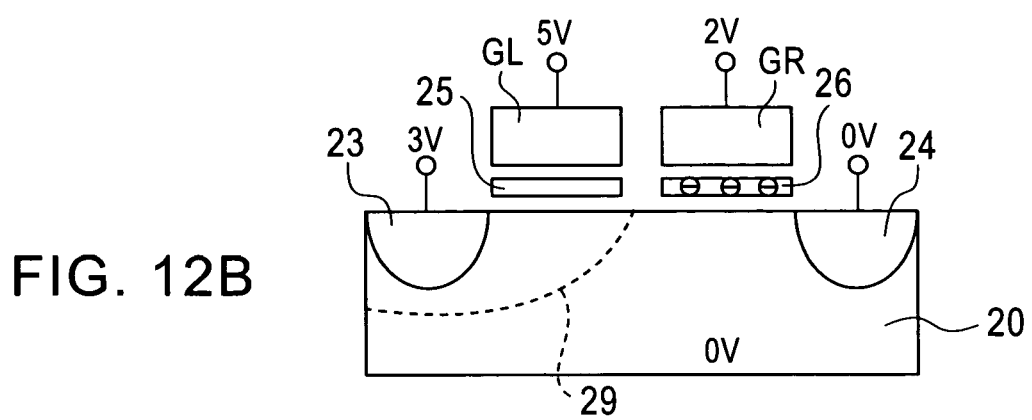
Figure 12C:
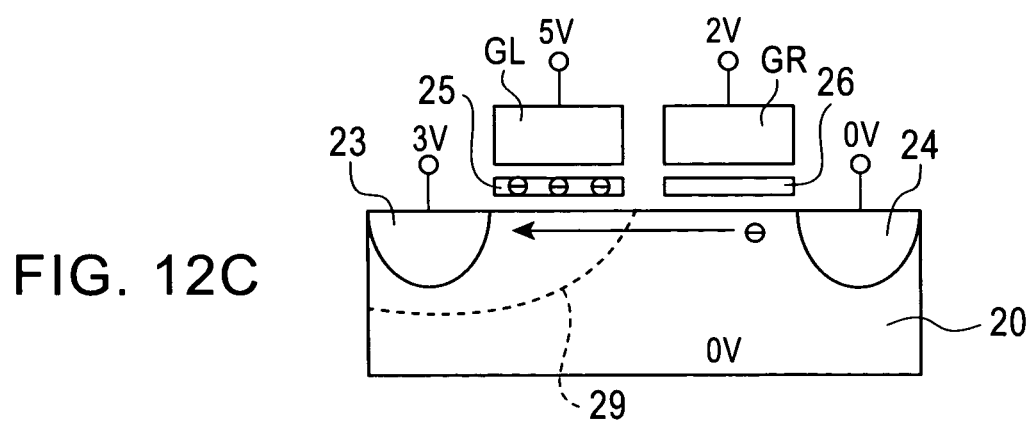
Figure 12D:
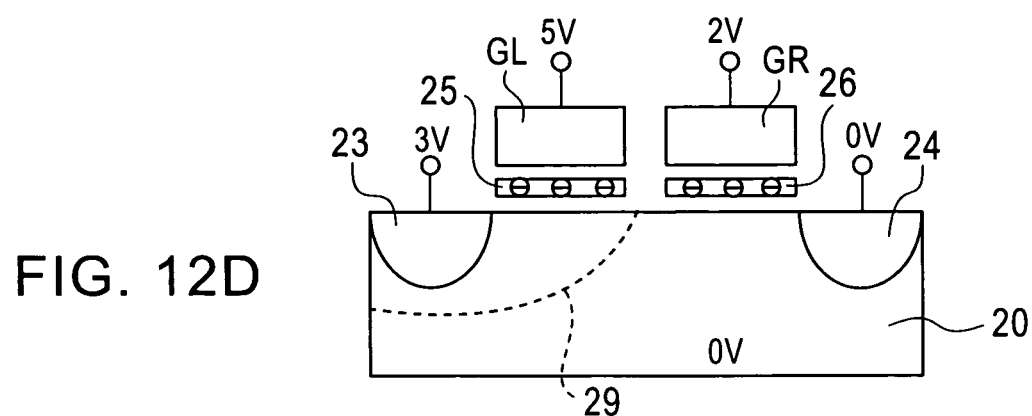

When electrons do not exist in the left side gate insulation film 25 and electrons exist in the right side gate insulation film 26 in FIG. 12B, electrons do not flow through the channel, and only data at the right side can be seen (readable). When electrons exist in the left side gate insulation film 25 and electrons do not exist in the right side gate insulation film 26 in FIG. 12C, electrons flow into the left side via the channel, and only data at the right side becomes readable. When electrons exist in the left side gate insulation film 25 and the right side gate insulation film 26 in FIG. 12D, electrons do not flow through the channel, and only data at the right side becomes readable.

FIG. 13A to FIG. 13D are diagrams depicting examples of the voltage conditions for reading the left side in the memory cell 10 of FIG. 2B.

When the data in the left side gate insulation film 25 is read, the voltage applying conditions are, for example, 0V for the substrate 20, 2V for the left side gate electrode GL, 5V for the right side gate electrode GR, 0V for the left side impurity region 23, and 3V for the right side impurity region 24. When electrons do not exist in the left side gate insulation film 25 and the right side gate insulation film 26 in FIG. 13A, the right side cannot be read because the depletion layer 29 spreads to the right side. Also, electrons generated from the left side impurity region 23 flow into the right side impurity region 24 via the channel, and only data at the left side becomes readable. Thus, data in the left side gate insulation film 25 can be read correctly.

Figure 13A:
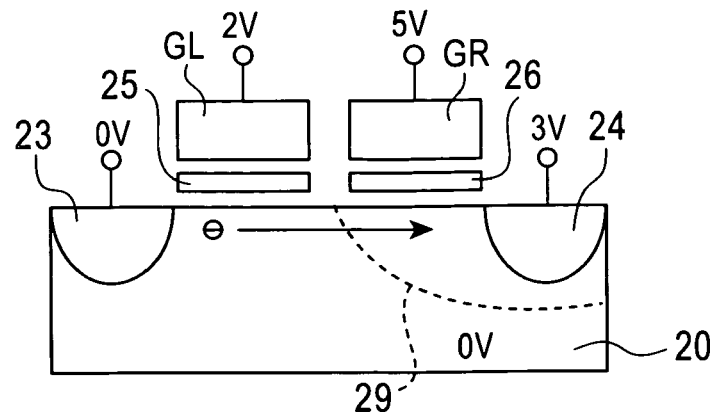
FIG. 13A, FIG. 13B, FIG. 13C and FIG. 13D are diagrams depicting examples of the voltage conditions for reading the left side in the memory cell of FIG. 2B.
Figure 13B:
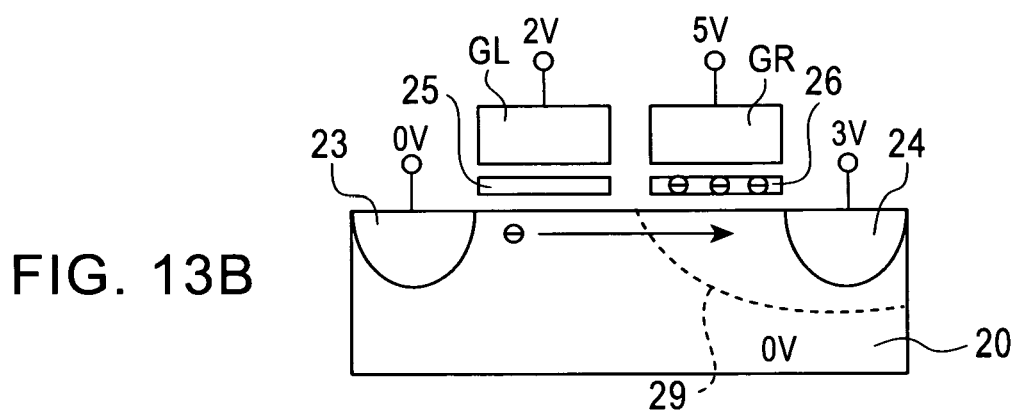
Figure 13C:
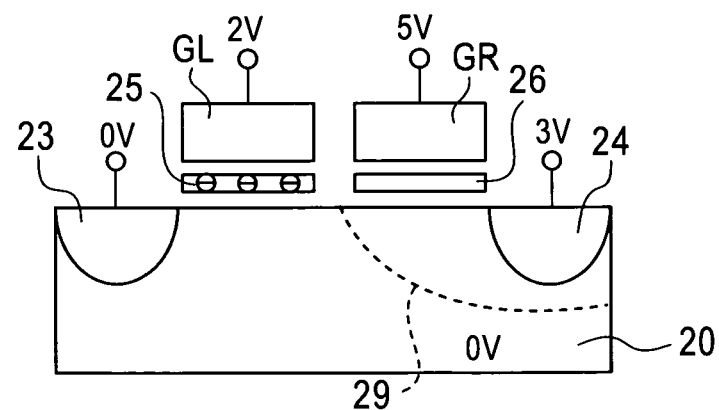
Figure 13D:
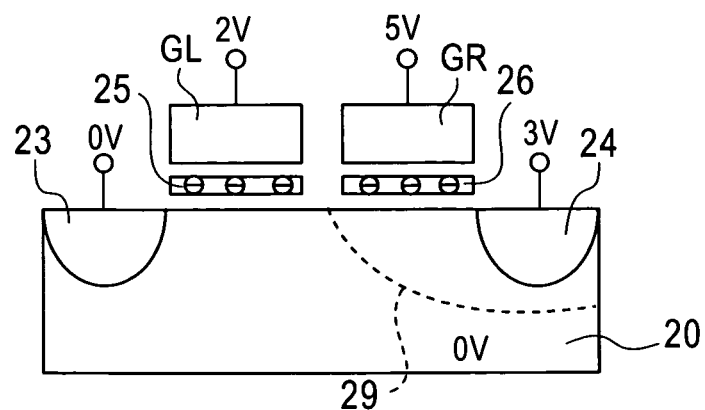

When electrons do not exist in the left side gate insulation film 25 and electrons exist in the right side gate insulation film 26 in FIG. 13B, electrons flow through the channel to the right side and only data at the right side becomes readable. When electrons exist in the left side gate insulation film 25 and electrons do not exist in the right side gate insulation film 26 in FIG. 13C, electrons do not flow through the channel, and only data at the left side becomes readable. When electrons exist in the left side gate insulation film 25 and the right side gate insulation film 26 in FIG. 13D, electrons do not flow through the channel and only data at the left side becomes readable.

As understood from the above, the write method, erase method and read method according to Embodiment 1 provide the following advantages (a) to (c).

(a) The conventional memory cell according to Japanese Patent Laid-Open No. 2003-51558 has three types of gate electrodes, but Embodiment 1 has two types of gate electrodes, GL and GR, so that the structure of Embodiment 1 is simple and manufacturing is easy.

(b) The gate length can be decreased compared with the prior art, so that reading and writing can be performed faster.

(c) Writing can be performed with low current and low voltage, so that power consumption can be reduced.

(Disturb of Memory Array Section)

In FIG. 1, the voltage conditions when writing is performed to the memory transistor 12-(i+1), for example, is shown. The memory array section 9 is configured such that when writing is performed to this memory transistor 12-(i+1), the adjacent memory transistors 12-i and 11-(i+2) do not receive a disturb (write error). The disturb will now be described in detail.

Figure 14A:
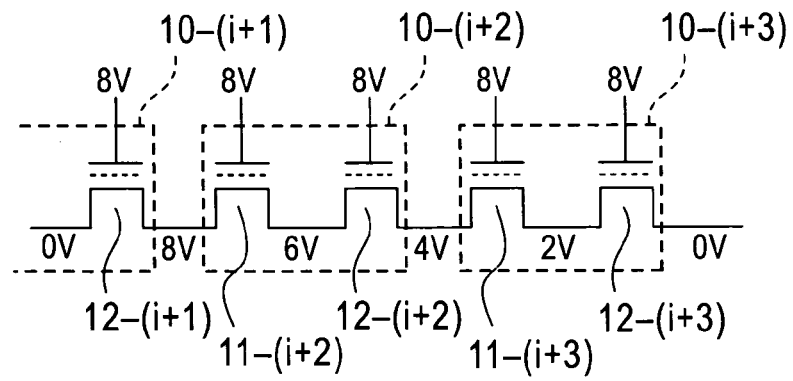
FIG. 14A, FIG. 14B and FIG. 14C are diagrams depicting the write operation in FIG. 1.
Figure 14B:
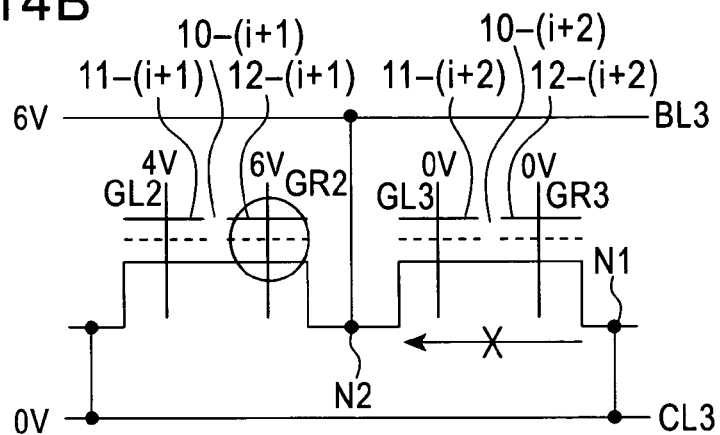
Figure 14C:
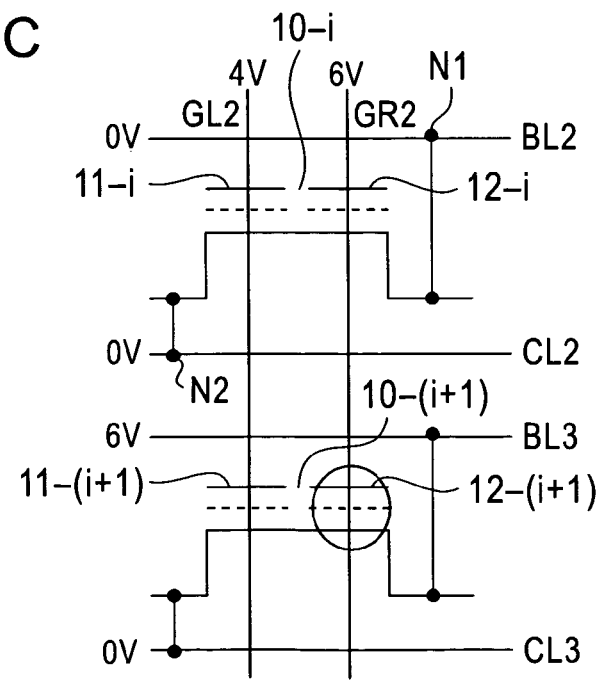

FIG. 14A to FIG. 14C are diagrams depicting the write operation in FIG. 1. In FIG. 14A, when data is written to the memory transistor 12-(i+1) among the memory transistors 12-(i+1), 11-(i+2), 12-(i+2), 11-(i+3) and 12-(i+3) in the memory cells 10-(i+1) to 10-(i+3) in a same row, for example, it is assumed that the voltage applying conditions are: the gate voltage of each memory transistor 12-(i+1), . . . is 8V, and the source-drain voltage of each memory transistor 12-(i+1), . . . , is 0V.

Data is written to the memory transistor 12-(i+1), but data may be written to the other memory transistors 11-(i+2), 12-(i+2), 11-(i+3) and 12-(i+3), which are not supposed to be written to. To prevent this, the intermediate potentials 8V, 6V, 4V and 2V, as shown in FIG. 14A, are supplied to the source-drain voltage of the other memory transistors 11-(i+2), 12-(i+2), 11-(i+3) and 12-(i+3).

The data must not be written to memory transistors other than one which is supposed to be written to, but this writing error may easily occur depending on the voltage applying conditions. So in Embodiment 1, the voltage applying conditions are set as shown in FIG. 14B and FIG. 14C, to control writing.

In FIG. 14B, if data is written to the memory transistor 12-(i+1) among the memory transistors 11-(i+1) and 12-(i+1) of the memory cell 10-(i+1), and the memory transistors 11-(i+2) and 12-(i+2) of the memory cell 10-(i+2) which are in a same row, for example, then the voltage applying conditions are set such that the bit line BL3 is 6V, the control line CL3 is 0V, the left side gate electrode GL2 is 4V, the right side gate electrode GR2 is 6V, the left side gate electrode GL3 is 0V and the right side gate electrode GR3 is 0V so that the adjacent memory transistors 11-(i+2) and 12-(i+2) are not disturbed. With such voltage conditions, the data is written to the memory transistor 12-(i+1), but no write error occurs in the adjacent memory transistors 11-(i+2) and 12-(i+2). In the memory transistors 11-(i+2) and 12-(i+2), the gate electrodes GL3 and GR3 become 0V, so that the current cannot pass from the node N1 of the memory transistor 12-(i+2) to the node N2 of the memory transistor 11-(i+2).

In FIG. 14C, if data is written to the memory transistors 12-(i+1) among the memory transistors 11-i and 12-i of the memory cell 10-i and the memory transistors 11-(i+1) and 12-(i+1) of the memory cell 10-(i+1), which are in different rows, for example, the voltage applying conditions are set such that the bit line BL2 and the control lines CL2 and CL3 are 0V, the bit line BL3 is 6V, the left side gate electrode GL2 is 4V, and the right side gate electrode GR2 is 6V, so that the memory transistors 11-i and 12-i in the adjacent rows are not disturbed. With such voltage conditions, the data is written in the memory transistor 12-(i+1), but not written into the memory transistors 11-i and 12-i in the adjacent rows because the node N1 of the memory transistor 12-i and the node N2 of the memory transistors 11-i become 0V, and current cannot pass through the node N1 to the node N2. Thus, a write error does not occur.

In this way according to the drive method for the memory cell array section of Embodiment 1, when data is written to a memory transistor 12-(i+1), the adjacent memory transistors 12-i and 11-(i+2) are not disturbed.

(Write Operation in Memory Cell Array Section in FIG. 1)

FIG. 15A to FIG. 15D are circuit diagrams depicting the voltage applying conditions and the current supply conditions during writing in the memory cell array section of FIG. 1.

Figure 15A:
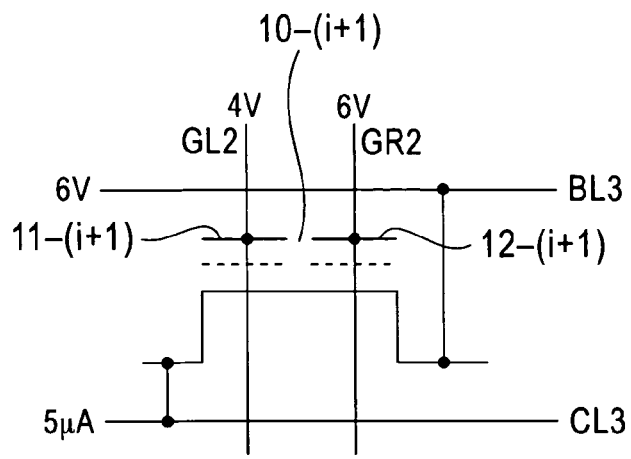
FIG. 15A, FIG. 15B, FIG. 15C and FIG. 15D are circuit diagrams depicting the voltage applying conditions and the current supply conditions during writing in the memory cell array shown in FIG. 1.

For example, in the left side memory transistor 11-(i+1) and the right side memory transistor 12-(i+1) of the memory cell 10-(i+1) in FIG. 15A, if electrons do not exist in the left side memory transistor 11-(i+1) during writing to the right side memory transistor 12-(i+1), the voltage applying conditions and the current supply conditions are set such that the bit line BL3 is 6V, the left side gate electrode GL2 is 4V, and the right side gate electrode GR2 is 6V, and the current 5 μA is supplied to the control line CL3. As a result, data is written only to the right side memory transistor 12-(i+1).

Figure 15B:
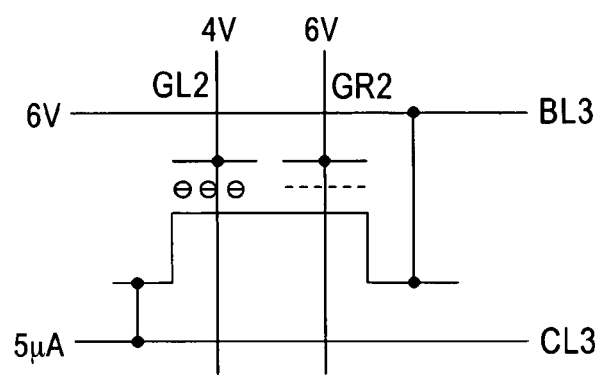

In the memory cell 10-(i+1) in FIG. 15B, if electrons exist in the left side memory transistor 11-(i+1) during writing to the right side memory transistor 12-(i+1), the same voltage applying conditions and the same current supply conditions as FIG. 15A are set. Then, the data is written only to the right side memory transistor 12-(i+1).

Figure 15C:
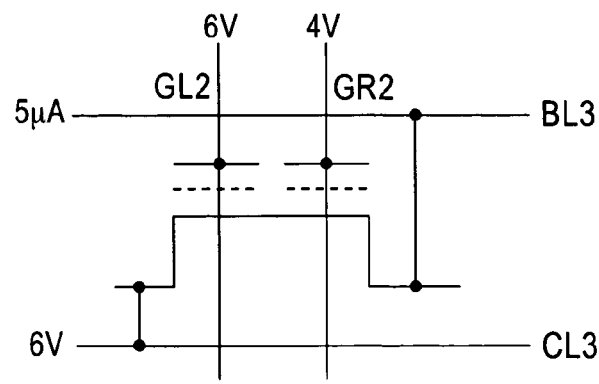

In the memory cell 10-(i+1) in FIG. 15C, if electrons do not exist in the right side memory transistor 12-(i+1) during writing to the left side memory transistor 11-(i+1), the voltage applying conditions and the current supply conditions are set such that the control line CL3 is 6V, the left side gate electrode GL2 is 6V, and the right side gate electrode GR2 is 4V, and the current 5 μA is supplied to the bit line BL3. With these voltage and current conditions, the data is written only to the left side memory transistor 11-(i+1).

Figure 15D:
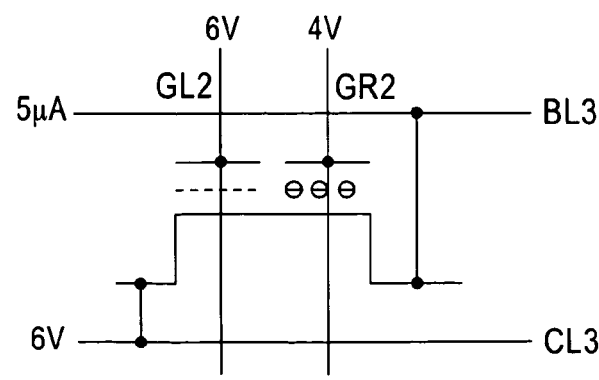

In the memory cell 10-(i+1) in FIG. 15D, if electrons exist in the right side memory transistor 12-(i+1) during writing to the left side memory transistor 11-(i+1), the same voltage applying conditions and the same current supply conditions as FIG. 15C are set. Consequently, the data is written only to the left side memory transistor 11-(i+1).

In this way, when data is written to the left side memory transistor 11-(i+1) of the memory cell 10-(i+1), a predetermined voltage is applied and a predetermined current is supplied regardless of absence and existence of the electrons in the right side memory transistor 12-(i+1). When data is written to the right side memory transistor 12-(i+1), on the other hand, a voltage the opposite of the above is applied and a current the opposite of the above is supplied regardless of absence and existence of the electrons in the left side memory transistor 11-(i+1).

(Right Side Reading in the Memory Cell Array Section 9)

FIG. 16A to FIG. 16D are circuit diagrams depicting the voltage applying conditions during reading the right side of the memory cell array section 9 in FIG. 1.

Figure 16A:
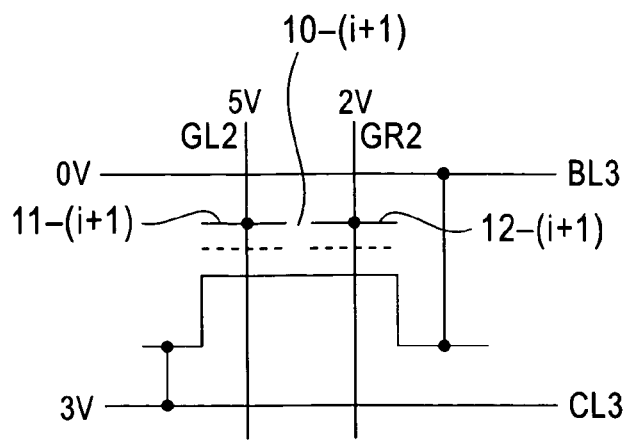
FIG. 16A, FIG. 16B, FIG. 16C and FIG. 16D are circuit diagrams depicting the voltage applying conditions during reading the right side of the memory cell array shown in FIG. 1.
Figure 16B:
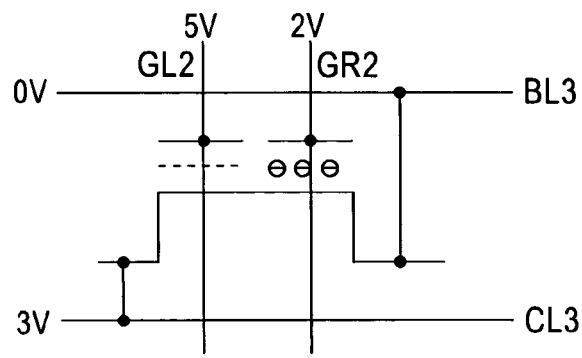
Figure 16C:
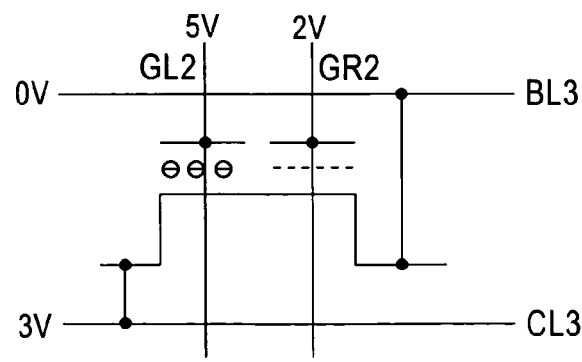
Figure 16D:
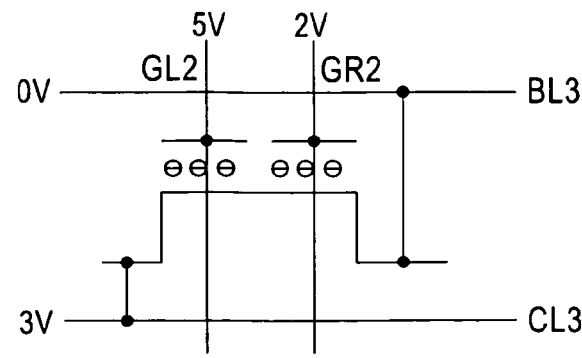

FIG. 16A is a diagram when electrons do not exist in the left and right memory transistors 11-(i+1) and 12-(i+1) of the memory cell 10-(i+1) while the data is read from the right side memory transistor 12-(i+1) of the memory cell 10-(i+1). FIG. 16B is a diagram when electrons do not exist in the left side memory transistor 11-(i+1) and electrons exist in the right side memory transistor 12-(i+1), FIG. 16C is a diagram when electrons exist in the left side memory transistor 11-(i+1) and electrons do not exist in the right side memory transistor 12-(i+1), and FIG. 16D is a diagram when electrons exist in the left and right memory transistors 11-(i+1) and 12-(i+1).

When the data is read from right side memory transistor 12-(i+1), the voltage applying conditions are set such that the control line CL3 is 3V, the left side gate electrode GL2 is 5V, the right side gate electrode GR2 is 2V, and the bit line BL3 is 0V whether electrons exist or not in the left and right memory transistors 11-(i+1) and 12-(i+1). As a result, only the data of the right side memory transistor 12-(i+1) is read.

(Left Side Reading in the Memory Cell Array Section 9)

FIG. 17A to FIG. 17D are circuit diagrams depicting the voltage applying conditions during reading from the left side of the memory cell array section 9 in FIG. 1.

Figure 17A:
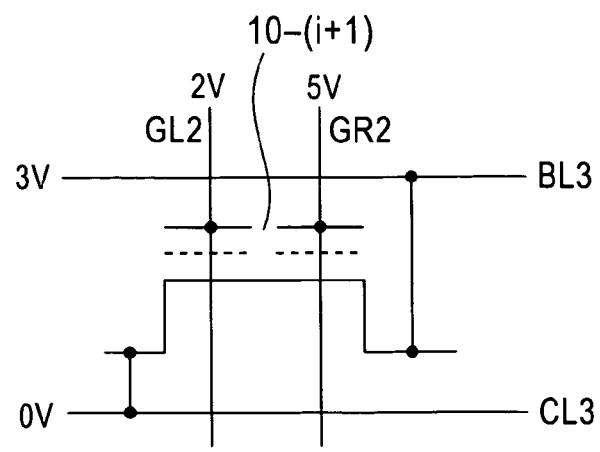
FIG. 17A, FIG. 17B, FIG. 17C and FIG. 17D are circuit diagrams depicting the voltage applying conditions during reading the left side of the memory cell array shown in FIG. 1.
Figure 17B:
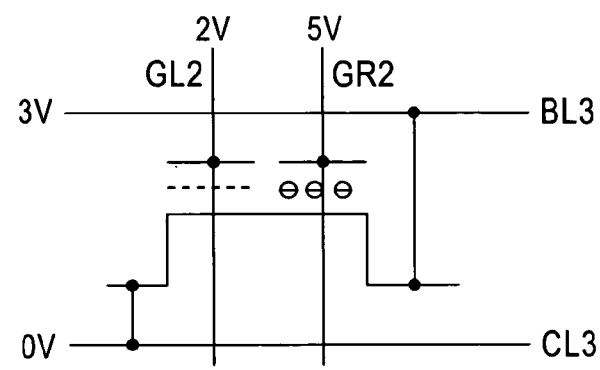
Figure 17C:
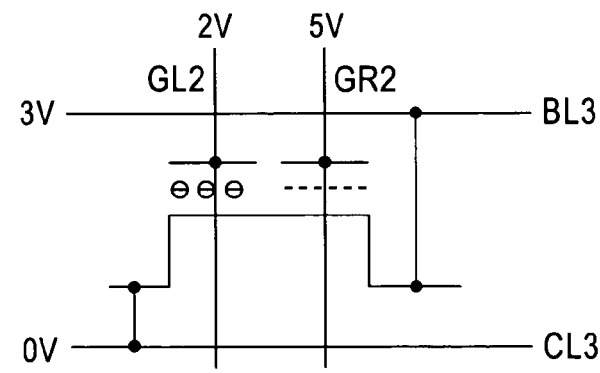
Figure 17D:
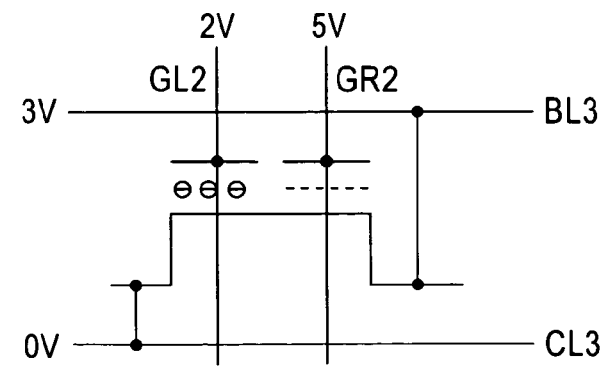

FIG. 17A is a diagram when electrons do not exist in the left and right memory transistors 11-(i+1) and 12-(i+1) of the memory cell 10-(i+1) while the data is read from the left side memory transistor 11-(i+1) of the memory cell 10-(i+1). FIG. 17B is a diagram when electrons do not exist in the left side memory transistor 11-(i+1) and electrons exist in the right side memory transistor 12-(i+1), FIG. 17C is a diagram when electrons exist in the left side memory transistor 11-(i+1) and electrons do not exist in the right side memory transistor 12-(i+1), and FIG. 17D is a diagram when electrons exist in the left and right side memory transistors 11-(i+1) and 12-(i+1).

When the data of the left side memory transistor 11-(i+1) is read, the voltage applying conditions are set such that the bit line BL3 is 3V, the left side gate electrode GL2 is 2V and the right side gate electrode GR2 is 5V, which is the opposite of FIG. 16A, and the control line CL3 is 0V whether electrons exist or not in the left and right memory transistors 11-(i+1) and 12-(i+1). As a result, only the data of the left side memory transistor 11-(i+1) is read.

Embodiment 2

Figure 19A:
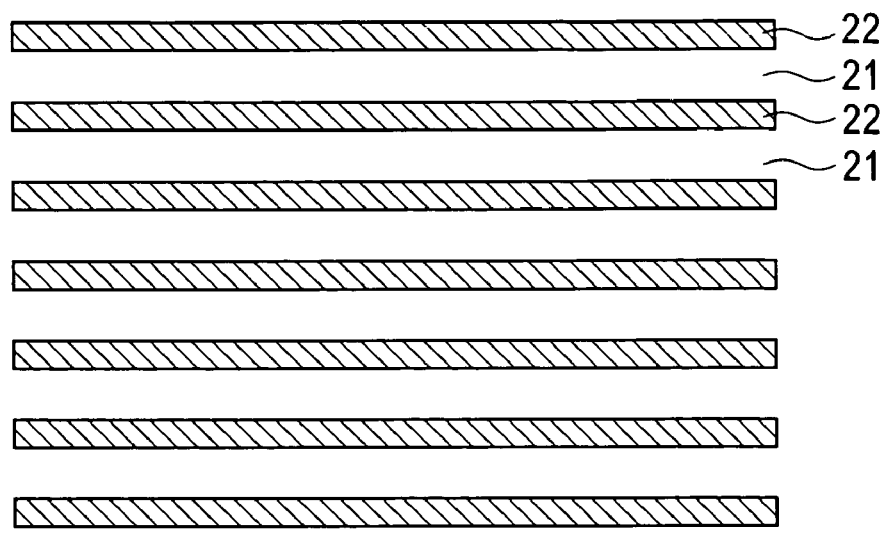
FIG. 19A, FIG. 19B and FIG. 20 are the layout diagrams of FIG. 18A to FIG. 18F.
Figure 19B:
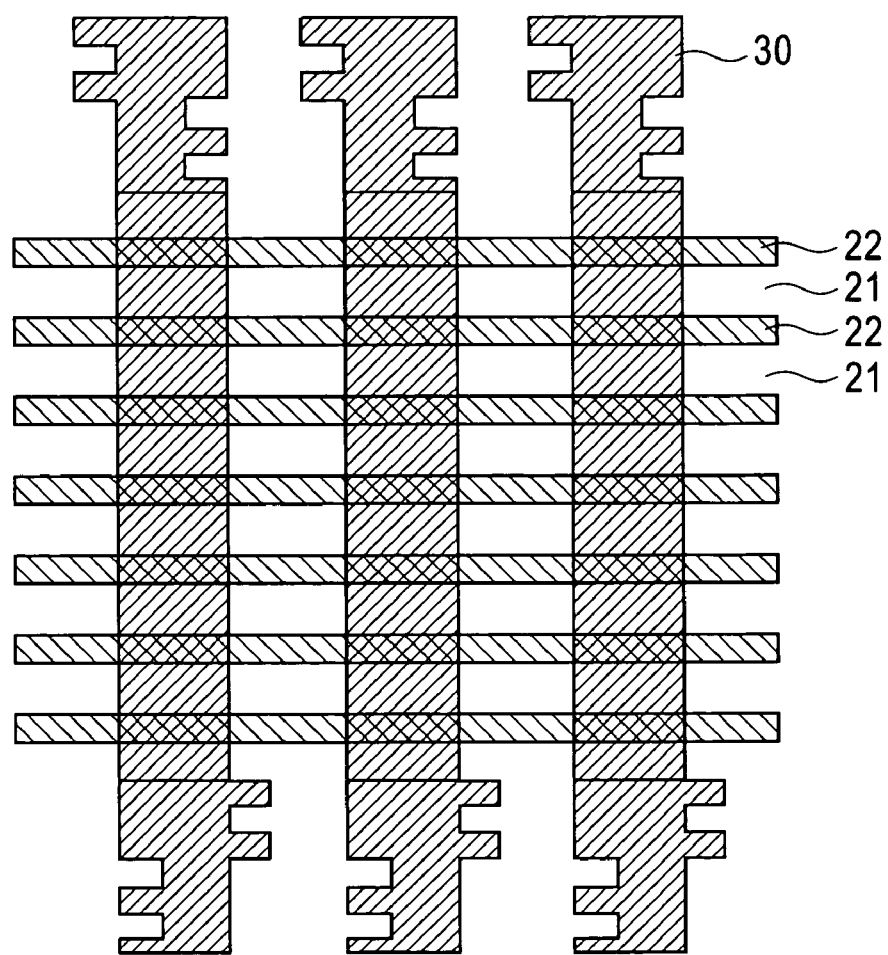
Figure 20:
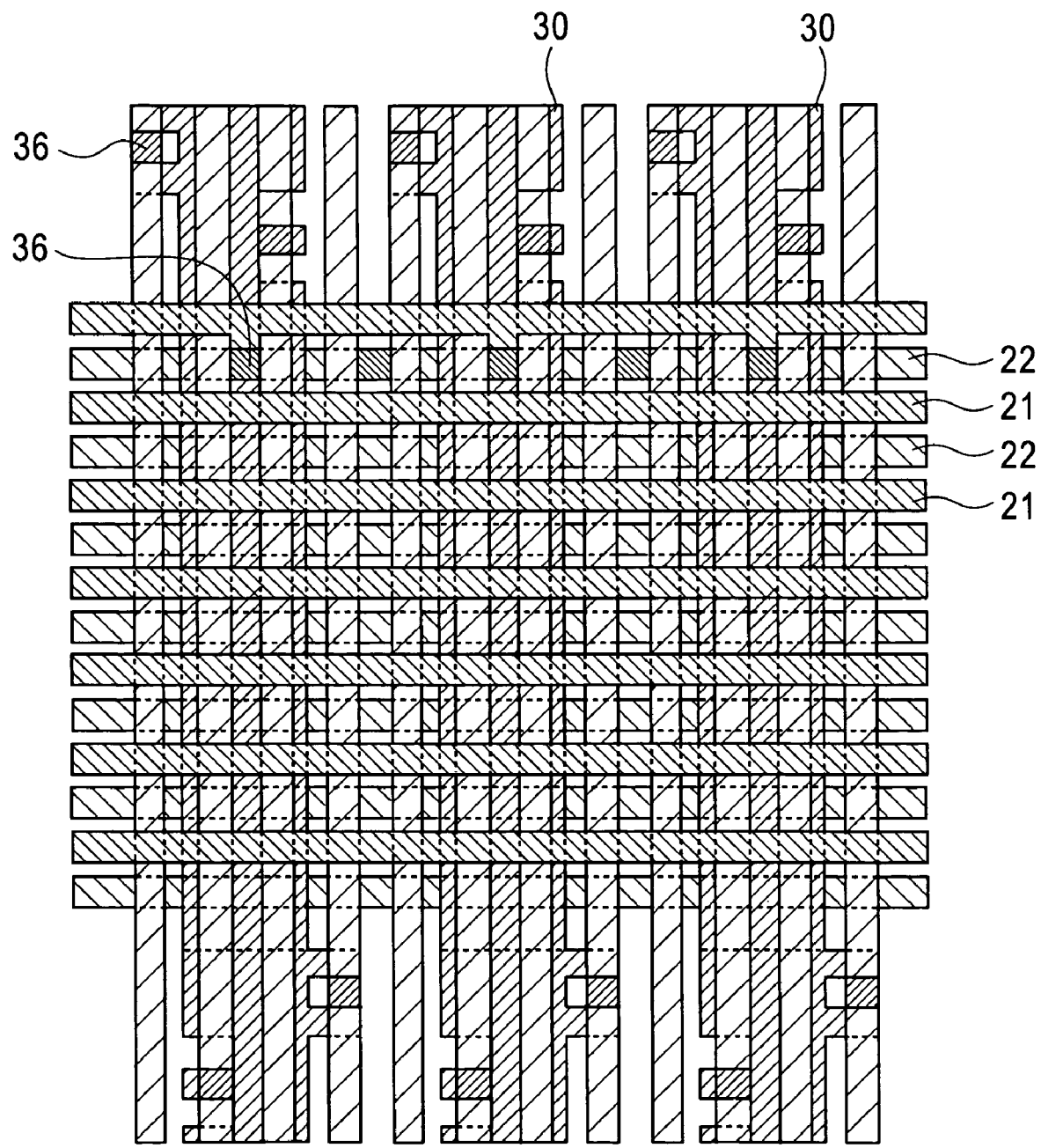

FIG. 18A to FIG. 18F are a series of diagrams depicting the manufacturing steps for manufacturing the non-volatile semiconductor memory device in FIG. 1. FIG. 18A to FIG. 18F are cross-sectional views taken along the 2B-2B line in FIG. 2A. FIG. 19A and FIG. 19B and FIG. 20 are layout diagrams of FIG. 18A to FIG. 18F.

The non-volatile semiconductor memory device is manufactured by the following steps 1 to 6, for example.

Figure 18A:
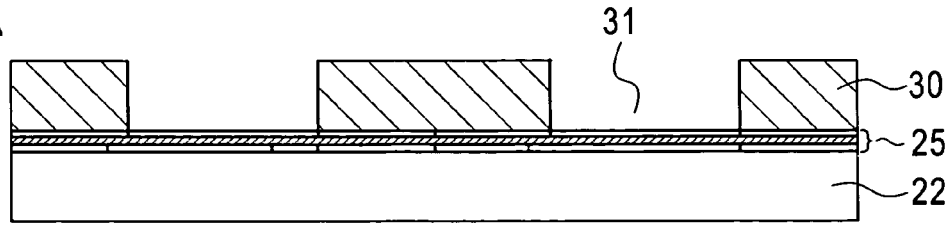
FIG. 18A, FIG. 18B, FIG. 18C, FIG. 18D, FIG. 18E and FIG. 18F is a series of diagrams depicting the manufacturing steps of the method for manufacturing the non-volatile semiconductor memory device shown in FIG. 1.

(1) Step 1 in FIG. 18A

On the surface of the substrate (e.g., p-type silicon substrate) 20, a plurality of parallel strip-type element isolation regions 21 shown in FIG. 19a are formed horizontally (in the width direction) to isolate each memory cell 10 by a photolithography technology using a resist mask. Between each two adjacent element isolation regions 21, a strip-type active region 22 is formed in the horizontal direction. On the entire surface of the silicon substrate 20, the left side gate insulation film (e.g., left side ONO oxide film with a three-layer structure of O/N/O) 25 made of the first gate insulation film material is formed by chemical vapor deposition (hereafter called "CVD"), for example. A nitride layer (SiN) 30 which serves as a sacrifice layer is deposited on the left side gate insulation film 25. On the nitride film 30, a resist film, which is not illustrated, is formed, and a mask pattern (resist pattern), which is not illustrated, is formed by etching the resist film using a photolithography technology. Using the mask pattern as a mask, the left side gate electrode, the right side impurity region (e.g., drain region), and the right side gate electrode area of the adjacent memory cell on the nitride film 30 are removed by etching in parallel in the vertical direction as shown in FIG. 19B, so as to form the first openings 31.

Figure 18B:
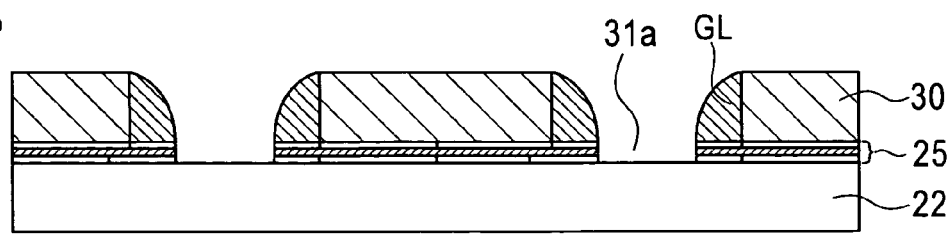

(2) Step 2 in FIG. 18B

The first gate electrode material (e.g., n+ polysilicon for left side gate electrode) is deposited on the entire surface by CVD. The n+ polysilicon on the entire face is etched and the side wall (SW) type left gate electrode GL, made of n+ polysilicon, is formed on the side face of the inner wall of the first opening 31. The side wall (SW) width is the gate length.

Figure 18C:
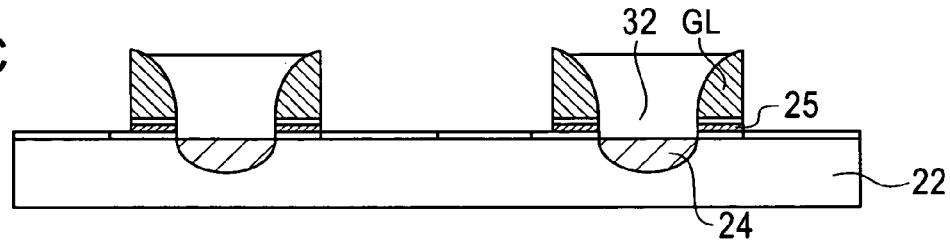

(3) Step 3 in FIG. 18C

Impurity ions such as phosphorous and arsenic are implanted from the opening 31a between the left side gate electrodes GL by self-aligning using the nitride film 30 and the left side gate electrodes GL as a mask, and the right side impurity region (e.g., drain region) 24 is formed by diffusion. The NSG insulation film 32 is deposited on the entire surface by CVD to fill the opening 31a, the entire face is planarized by etching, then the nitride film 30 is removed by an etchant, and also the upper oxide film (O) and the nitride film (N) thereunder are removed from the left side gate ONO film 25 under this nitride film 30.

Figure 18D:
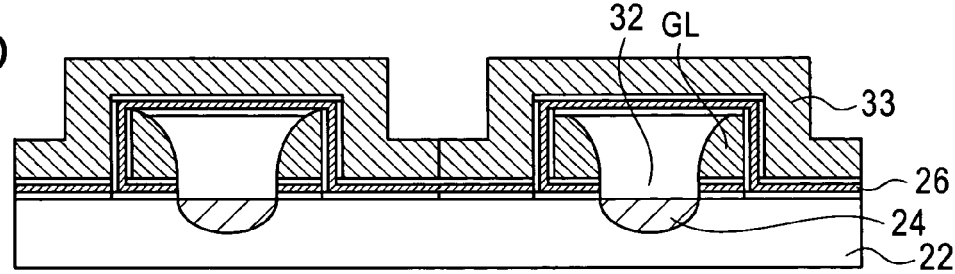

(4) Step 4 in FIG. 18D

The right side gate insulation film (e.g., right side ONO oxide film with a three-layer structure of O/N/O) 26 made of the second gate insulation film material is formed on the entire face by CVD, and the second gate electrode material (e.g., n+ polysilicon for the right side electrode) 33 is deposited thereon.

Figure 18E:
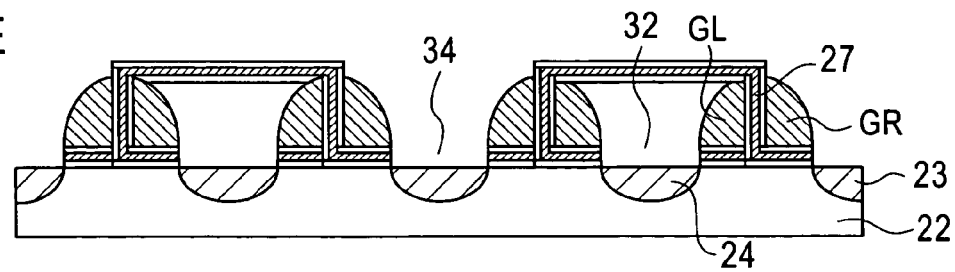

(5) Step 5 in FIG. 18E

The n+ polysilicon 33 undergoes the entire face etching. On the side face of the inter-gate-electrode insulation film 27 made of the right side ONO oxide film 26 adhered to the side wall of the left side gate electrode GL, the side wall (SW) type right gate electrode GR made of n+ polysilicon 33 is formed. Impurity ions such as phosphorous and arsenic are implanted from the second opening 34 between the right side gate electrodes GR, and the left side impurity region (e.g., source region) 23 is formed by diffusion.

Figure 18F:
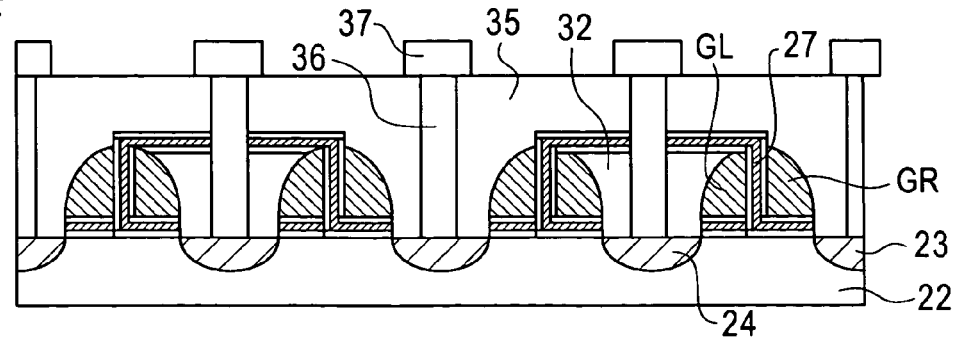

(6) Step 6 in FIG. 18F

The intermediate insulation film 35 is deposited on the entire face by CVD, and the contact holes 36 shown in FIG. 20 are formed using resist, which is not illustrated, as an etching mask. The inter-connect layer is formed on the entire face and the contact holes 36 are buried therein. The wires 37 are formed by etching the inter-connect layer in a predetermined pattern by a photolithography technology. Then protective film is coated, and the manufacturing of the non-volatile semiconductor memory device is completed.

According to this manufacturing method, the mask of the mask pattern to be used for manufacturing the memory cell is created only twice, i.e., when the active region 22 is formed and when the nitride film 30 is etched. The rest of the manufacturing steps mostly relies upon self alignment. Therefore the following advantages (a) to (c) are obtained.

(a) Irregularity in the memory cell characteristics caused by mask misalignment does not occur.

(b) Memory cell size can be decreased since a mask alignment margin is not necessary.

(c) Manufacturing cost can be decreased since memory cells can be formed by two layers of mask.

The present invention is not limited to the above described and illustrated embodiments. For example, the p-type silicon substrate 20 is used as a substrate in the above described manufacturing process, but other substrates such as a p-well or p-type SOI layer may be used. The cross-sectional structure in FIG. 18A to FIG. 18F and the layout in FIG. 19A, FIG. 19B and FIG. 20 may be changed to other formats, and the particular technologies and the materials used in the above described manufacturing process may also be changed to any suitable ones.

This application is based on a Japanese Patent Application No. 2005-36144 filed on Feb. 14, 2005, and the entire disclosure thereof is incorporated herein by reference.

What is claimed is:

1. A non-volatile semiconductor memory device comprising:
    a substrate having a surface;
    a plurality of memory cells formed in a matrix on the substrate, said memory cell including:
        a first conductive type active region formed on the surface of said substrate,
        a second conductive type first impurity region formed in said active region,
        a channel formation region formed in said active region,
        a second conductive type second impurity region formed in said active region such that the second conductive type first impurity region and the second conductive type second impurity region sandwich the channel formation region,
        a first gate insulation film which has charge storage capability and is formed closer to said first impurity region on said channel formation region,
        a second gate insulation film which has charge storage capability and is formed closer to said second impurity region on said channel formation region,
        a first gate electrode formed on said first gate insulation film,
        a second gate electrode formed on said second gate insulation film, and
        an inter-gate-electrode insulation film formed on said channel formation region, wherein the inter-gate-electrode insulation film is a three-layer film consisting of a first oxide film, a nitride film and a second oxide film, and is disposed between the first gate electrode and the second gate electrode, so that the first gate electrode is in direct contact with the first oxide film, the second gate electrode is disposed in direct contact with the second oxide film, and the nitride film is disposed between and in direct contact with the first and second oxide films; and
    a plurality of pairs of lines that include a bit line and a control line formed in parallel with the channel on said substrate, the pairs including a first pair, wherein:
    said memory cells include a plurality of memory cells that collectively form a row extending in a direction parallel to the bit line, the memory cells in the row being disposed between the bit line and the control line of the first pair, each memory cell in the row having both the first and second impurity regions, each memory cell in the row being alternately connected with the bit line or the control line of the first pair, the first gate electrode and the second gate electrode in each memory cell in the row being formed in strips in a direction perpendicular to the channel in each memory cell in the row; and
    two adjacent memory cells in the row are disposed, such that the second impurity region of one memory cell is disposed next to and connected with the first impurity region of the adjacent memory cell.

2. The non-volatile semiconductor memory device according to claim 1, wherein said first gate insulation film and said second gate insulation film are respectively constructed by a three-layer structure of a top insulation film, a charge storage film having said charge storage capability, and a bottom insulation film.

3. The non-volatile semiconductor memory device according to claim 2, wherein said charge storage film includes a nitride film.

4. The non-volatile semiconductor memory device according to claim 3, wherein said top and bottom insulation films of said three-layer structure include an oxide film.

* * * * *